(12) United States Patent
Grotjohn et al.

(10) Patent No.: US 9,166,002 B2
(45) Date of Patent: Oct. 20, 2015

(54) N-DOPED SINGLE CRYSTAL DIAMOND SUBSTRATES AND METHODS THEREFOR

(75) Inventors: Timothy A. Grotjohn, Okemos, MI (US); Jes Asmussen, East Lansing, MI (US); Timothy Hogan, Grand Ledge, MI (US)

(73) Assignee: BOARD OF TRUSTEES OF MICHIGAN STATE UNIVERSITY, East Lansing, MI (US)

( * ) Notice: Subject to any disclaimer, the term of this patent is extended or adjusted under 35 U.S.C. 154(b) by 96 days.

(21) Appl. No.: 13/819,948

(22) PCT Filed: Aug. 31, 2011

(86) PCT No.: PCT/US2011/049865
§ 371 (c)(1),
(2), (4) Date: Feb. 28, 2013

(87) PCT Pub. No.: WO2012/030897
PCT Pub. Date: Mar. 8, 2012

(65) Prior Publication Data
US 2013/0153931 A1    Jun. 20, 2013

Related U.S. Application Data

(60) Provisional application No. 61/402,668, filed on Sep. 2, 2010.

(51) Int. Cl.
*H01L 29/06* (2006.01)
*H01L 21/02* (2006.01)
(Continued)

(52) U.S. Cl.
CPC ........ *H01L 29/0657* (2013.01); *H01L 21/0243* (2013.01); *H01L 21/0262* (2013.01); *H01L 21/02376* (2013.01); *H01L 21/02433* (2013.01); *H01L 21/02527* (2013.01); *H01L 21/02576* (2013.01); *H01L 21/02587* (2013.01); *H01L 21/02658* (2013.01); *H01L 21/02664* (2013.01);
(Continued)

(58) Field of Classification Search
USPC .............................. 257/77; 438/105
See application file for complete search history.

(56) References Cited

U.S. PATENT DOCUMENTS 4,758,399 A * 7/1988 Hamakawa et al. .......... 264/227
4,809,417 A   3/1989 Normann, Jr.
(Continued)

OTHER PUBLICATIONS

Kato, H., T. Makino, M. Ogura, N. Tokuda, H. Okushi, and S. Yamasaki, "Selective Growth of Buried n+ Diamond on (001) Phosphorus-Doped n-type Diamond Film," Applied Physics Express 2 (2009) 055502-1-3.
(Continued)

*Primary Examiner* — Khaja Ahmad
(74) *Attorney, Agent, or Firm* — Marshall, Gerstein & Borun LLP

(57) ABSTRACT

The disclosure relates to the formation of n-doped single crystal diamond (SCD). In general, a SCD substrate is preferentially anisotropically etched to provide one or more recesses in the SCD substrate, where the recesses are defined by (1 1 1) surface sidewalls resulting from the preferential anisotropic etching process. The recesses generally have a pyramidal shape. N-type doped SCD (e.g., using a phosphorous dopant) is then deposited into the preferentially anisotropically etched recesses. When the SCD substrate is a p-type diamond (e.g., using a boron dopant), the resulting structure can be used as a p-n junction, for example for use in various power electronic apparatus such as diodes, etc.

32 Claims, 11 Drawing Sheets

(51) Int. Cl.
*H01L 21/3065* (2006.01)
*H01L 29/16* (2006.01)

(52) U.S. Cl.
CPC ......... *H01L 21/3065* (2013.01); *H01L 29/1602* (2013.01)

(56) References Cited

U.S. PATENT DOCUMENTS

| | | | |
|---|---|---|---|
| 5,980,119 | A | 11/1999 | Furuyama |
| 6,025,060 | A | 2/2000 | Meissner |
| 7,172,957 | B2 | 2/2007 | Namba et al. |
| 7,476,895 | B2 | 1/2009 | Namba et al. |
| 2005/0127373 | A1 | 6/2005 | Yokota et al. |
| 2007/0111498 | A1* | 5/2007 | Nambo et al. ............... 438/607 |
| 2008/0254570 | A1 | 10/2008 | Kley |
| 2009/0239078 | A1 | 9/2009 | Asmussen et al. |
| 2010/0013057 | A1 | 1/2010 | D'Arrigo et al. |
| 2010/0034984 | A1 | 2/2010 | Asmussen et al. |
| 2011/0019426 | A1* | 1/2011 | Kuiseko et al. ............... 362/354 |

OTHER PUBLICATIONS

Kato, H., D. Takeuchi, N. Tokuda, H. Umezawa, H. Okushi, S. Yamasaki, "Characterization of Specific Contact Resistance on Heavily Phosphorus-Doped Diamond Films," Diamond & Related Materials, 18, (2009), 782-785.

Overton, T.W. and Shigley, J.E., "A History of Diamond Treatments," Gems and Gemology, Spring 2008, p. 32-52, 2008.

Ramamurti, R., Becker, M., Schuelke, T., Grotjohn, T., Reinhard, D., and Asmussen, J., "Synthesis of Boron-Doped Homoepitaxial Single Crystal Diamond by Microwave Plasma Chemical Vapor Deposition," Diamond and Related Materials, 17, 1320-1323, 2008.

Ramamurti, R., Becker, M., Schuelke, T., Grotjohn, T.A., Reinhard, D.K., and Asmussen, J., "Deposition of Thick Boron-Doped Homoepitaxial Single Crystal Diamond by Microwave Plasma Chemical Vapor Deposition," Diamond & Related Materials 18 (2009) 704-706.

Smirnov, W., Kriele, A., Brink, D., Mueller-Sebert, W., Hees, J., and Nebel, C., "Anisotropic Etching of Diamond by Nano/micrometer Sized Ni Particles and Their Formation," Symposium J, MRS Fall 2009, Boston.

Tran, D.T., Fansler, C., Grotjohn, T.A., Reinhard, D.K., and Asmussen, J., "Investigation of Mask Selectivities and Diamond Etching Using Microwave Plasma-Assisted Etching," Diamond and Related Materials, 19, 778-782, 2010.

Tran, D.T., Grotjohn, T.A., Reinhard, D.K., and Asmussen, J., "Microwave plasma-assisted etching of diamond," Diamond and Related Materials, 17, 717-721, 2008.

The International Search Report and the Written Opinion of the International Searching Authority, dated Dec. 8, 2011, for International Application No. PCT/US2011/049865.

* cited by examiner

N-DOPED SINGLE CRYSTAL DIAMOND SUBSTRATES AND METHODS THEREFOR

CROSS-REFERENCE TO RELATED APPLICATION

Priority is claimed to U.S. Provisional Application No. 61/402,668, filed Sep. 2, 2010, the disclosure of which is incorporated herein by reference in its entirety.

BACKGROUND OF THE DISCLOSURE

Field of the Disclosure

The disclosure relates to the formation of n-doped single crystal diamond (SCD). In general, a SCD substrate is preferentially anisotropically etched to provide one or more recesses in the SCD substrate, where the recesses are defined by (111) surface sidewalls resulting from the preferential anisotropic etching process. N-type SCD (e.g., using a phosphorous dopant) is then deposited into the preferentially etched recesses. When the SCD substrate is a p-type diamond, the resulting structure can be used as a p-n junction, for example for use in various power electronic apparatus such as diodes, etc.

SUMMARY

The disclosure generally relates to the use of single crystal diamond (SCD) for high-voltage, high-power and high-temperature electronics to utilize its advantageous properties such as wide bandgap of 5.45 eV, large electric field breakdown strength of 10 MV/cm, and high thermal conductivity. Diamond power electronics have the capability to exceed the performance of other wide bandgap semiconductors for high operating voltages of greater than 10's kV and high operating temperatures above 250° C. A limiting step in the use of SCD in such electronics is the lack of shallow donors and acceptors for combining n-type and p-type diamond in the same SCD structure. P-type diamond can be formed with a boron dopant, which has a deep acceptor energy level of 0.37 eV. N-type diamond has been a more difficult challenge to solve. When using a phosphorus dopant to form n-type diamond, high phosphorus concentrations can be more readily incorporated into the (111) surface during homoepitaxial growth as opposed to the (100) surface. However, homoepitaxial growth of diamond on the (111) surface gives poorer quality diamond as compared to growth on the (100) surface. An object of this disclosure is to provide methods to grow high quality doped SCD (e.g., on (100) substrate surfaces thereof) while also permitting the growth of n-doped SCD (e.g., phosphorus-doped) in spatially local regions on the SCD substrate having (111) surfaces in order to achieve a low resistivity n-type diamond.

The dopants in diamond are suitably incorporated during epitaxial growth rather than by ion implantation as is often used for other semiconductor materials. More particularly, the disclosure relates to the formation of n-doped SCD regions (e.g., highly doped or "$n^+$" doped regions) on a (100) surface of a SCD substrate by microstructuring the (100) surface with a preferential etching process to form (111) microsurfaces defining a recess in the substrate for deposition of the n-doped SCD therein. The disclosed methods can be combined with existing p-type doping methods (e.g., in which case the SCD substrate is a p-type SCD substrate) to build p-n junction structures that can be integrated into various components (e.g., p-n junction diodes, merged diodes and bipolar transistors) for applications in power electronics.

Diamond power electronics utilizing the disclosed methods and resulting apparatus can operate safely at elevated temperatures without requiring the extensive cooling and circuit protection efforts of current technology used in electrical power generation, distribution, and exploitation. For example, the disclosed methods and apparatus can be incorporated into more efficient electric vehicles and high-speed trains with high electrical power output densities. Direct connection of diamond power electronics to the electrical distribution and transmission systems of the power grid can facilitate much more efficient connection of alternative energy sources such as wind to the power grid. Diamond-based power devices can provide high-voltage switching with greater efficiency and higher current levels. Hence the exceptional semiconductor properties of diamond have enormous potential for high-power electronics technology with applications in transportation, manufacturing, and energy sectors.

In an embodiment of the disclosure, a method for forming an n-doped single crystal diamond (SCD) structure includes: (a) providing a SCD layer (e.g., $p^-$-type SCD, p-type SCD, having a boron impurity) having a growth surface (e.g., a (100) surface); (b) preferentially anisotropically etching (or preferentially etching) a recess in the SCD layer through the growth surface, the recess (A) being defined by one or more (111) surface sidewalls etched into the SCD layer through the growth surface and (B) having a base defined by the intersection of the sidewalls and the growth surface of the SCD layer; and (c) depositing n-doped SCD (e.g., having a phosphorous impurity) into the recess, thereby forming an n-doped SCD region in the recess and the resulting n-doped SCD structure.

In another embodiment of the disclosure, an n-doped single crystal diamond (SCD) structure comprises: (a) a SCD layer having a top surface and a bottom surface, the SCD layer comprising a recess region (A) being defined by one or more (111) surface sidewall planes in the SCD layer and intersecting the top surface thereof, and (B) having a base defined by the intersection of the sidewall planes and the top surface of the SCD layer; and (b) an n-doped SCD region comprising a top surface and an internal boundary between the SCD layer and the n-doped SCD region defined by the sidewall planes of the recess region; wherein the SCD layer and the n-doped SCD region share the same single crystal structure.

In another embodiment of the disclosure, an n-doped single crystal diamond (SCD) structure comprises: (a) a SCD layer (e.g., $p^-$-type SCD or p-type SCD, such as from a boron impurity) having a top surface (e.g., a (100) surface) and a bottom surface, the SCD layer comprising a plurality of randomly positioned recess regions, each recess region (A) being defined by one or more (111) surface sidewall planes in the SCD layer and intersecting the top surface thereof, and (B) having a base defined by the intersection of the sidewall planes and the top surface of the SCD layer; and (b) a plurality of n-doped SCD regions (e.g., having a phosphorous impurity) positioned correspondingly to the plurality of randomly positioned recess regions, each n-doped SCD region comprising a top surface and an internal boundary between the SCD layer and the n-doped SCD region defined by the sidewall planes of the corresponding recess region; wherein the SCD layer and the plurality of n-doped SCD regions share the same single crystal structure. In an embodiment, the n-doped SCD regions can have pyramidal shapes with rectangular bases, the rectangular bases having a distribution of aspect ratios ranging from 1 to more than 1. In another embodiment, the internal boundaries between the n-doped SCD regions and the surrounding SCD layer can be further defined by a discontinuity in the concentration of an n-type dopant in the n-doped SCD regions and in the surrounding SCD layer across the sidewall planes of the corresponding recess region.

In another embodiment of the disclosure, an n-doped single crystal diamond (SCD) structure comprises: (a) a SCD layer having a top surface, the SCD layer comprising: (i) a bulk SCD region, and (ii) a plurality of randomly sized n-doped SCD regions distributed throughout the SCD layer and adjacent the bulk SCD region, each n-doped SCD region having a full or partial inverted pyramid shape comprising (1) a base corresponding to the top surface of the SCD layer and (2) sidewall surfaces corresponding to an interface between the n-doped SCD region and the bulk SCD layer; wherein: (A) the sidewall surfaces of the n-doped SCD regions are aligned along (111) planes in the SCD layer; and (B) the bulk SCD region and the plurality of n-doped SCD regions share the same single crystal structure in the SCD layer. In an embodiment, the bases of the plurality of randomly sized n-doped SCD regions can be rectangular and have a distribution of aspect ratios ranging from 1 to more than 1. In another embodiment, internal boundaries between the n-doped SCD regions and the bulk SCD region can be defined by a discontinuity in the concentration of an n-type dopant in the n-doped SCD regions and in the bulk SCD layer across the sidewall surfaces of the n-doped SCD regions.

In another embodiment of the disclosure, a diode comprises: (a) an n-doped single crystal diamond (SCD) structure according to any of various disclosed embodiments, wherein the SCD layer thereof is selected from the group consisting of $p^-$-type SCD and p-type SCD. The diode can further comprise: (b) a $p^+$-type SCD layer on a bottom surface of the n-doped SCD structure; (c) a metal contact layer on a top surface of the n-doped SCD structure and in contact with both the n-doped SCD region and the SCD layer top surface thereof; and (d) an ohmic contact layer on a surface of the $p^+$-type SCD layer. The ohmic contact layer can be on a bottom surface of the $p^+$-type SCD layer and opposes the n-doped SCD structure. Alternatively, the ohmic contact layer (i) can be on the same surface of the $p^+$-type SCD layer as the n-doped SCD structure and (ii) is isolated from the n-doped SCD structure.

Various modifications and extensions of the foregoing methods and structures are possible. For example, the recess or corresponding n-doped SCD region can have a full or partial pyramid shape with the base of the recess corresponding to the base of the pyramidal shape (e.g., rectangular, defined by four (111) surface sidewalls) and being substantially coplanar with the growth surface of the SCD layer. For example, the recess or corresponding n-doped SCD region can have the full pyramidal shape with an apex opposing the base and being defined by the intersection of the recess sidewalls, or the recess can have the partial pyramidal shape with a top surface opposing the base and being defined by a (100) surface wall etched into the SCD layer and intersected by the recess sidewalls. Preferentially anisotropically etching the recess in part (b) can comprise forming a plurality of randomly sized and positioned recesses having (111) surface sidewalls, the recesses having pyramidal shapes with rectangular bases having a distribution of aspect ratios ranging from 1 to more than 1. Preferentially anisotropically etching the recess in part (b) can further comprise (i) depositing a patterned metal layer (e.g., nickel) over the growth surface of the SCD layer (e.g., depositing a metal layer and then patterning the same), the patterned metal layer having a shape corresponding to a surface region to be preferentially anisotropically etched to form one or more recesses, thereby forming a metal-patterned SCD substrate; (ii) exposing the metal-patterned SCD substrate to a hydrogen source at a sufficiently high temperature (e.g., annealing or exposing to a hydrogen plasma), thereby preferentially anisotropically removing SCD material from the SCD layer under the patterned metal layer to form the sidewalls and the recess (e.g., to form a plurality of randomly sized recesses having (111) surface sidewalls, the recesses being randomly positioned in the SCD layer in a region corresponding to that of the patterned metal layer in part (i)); and (iii) removing metal remaining in the recess and/or on the growth surface after anisotropic removal of the SCD material. Depositing the n-doped SCD into the recess can comprise: (i) depositing an n-doped SCD layer over the SCD layer growth surface and in the recess (e.g., by CVD or PACVD); (ii) removing at least a portion of the deposited n-doped SCD layer over the SCD layer growth surface while leaving the deposited n-doped SCD layer in the recess (e.g., by etching, polishing, and/or planarizing), thereby forming the n-doped SCD region in the recess. Depositing the n-doped SCD layer can comprise performing a diamond chemical vapor deposition (CVD) process.

All patents, patent applications, government publications, government regulations, and literature references cited in this specification are hereby incorporated herein by reference in their entirety. In case of conflict, the present description, including definitions, will control.

Additional features of the disclosure may become apparent to those skilled in the art from a review of the following detailed description, taken in conjunction with the drawings, examples, and appended claims.

BRIEF DESCRIPTION OF THE DRAWINGS

For a more complete understanding of the disclosure, reference should be made to the following detailed description and accompanying drawings wherein.

levels of magnification. (Scale bar S is 1 μm in the top image and 10 μm in the bottom image.)

Figure 4:
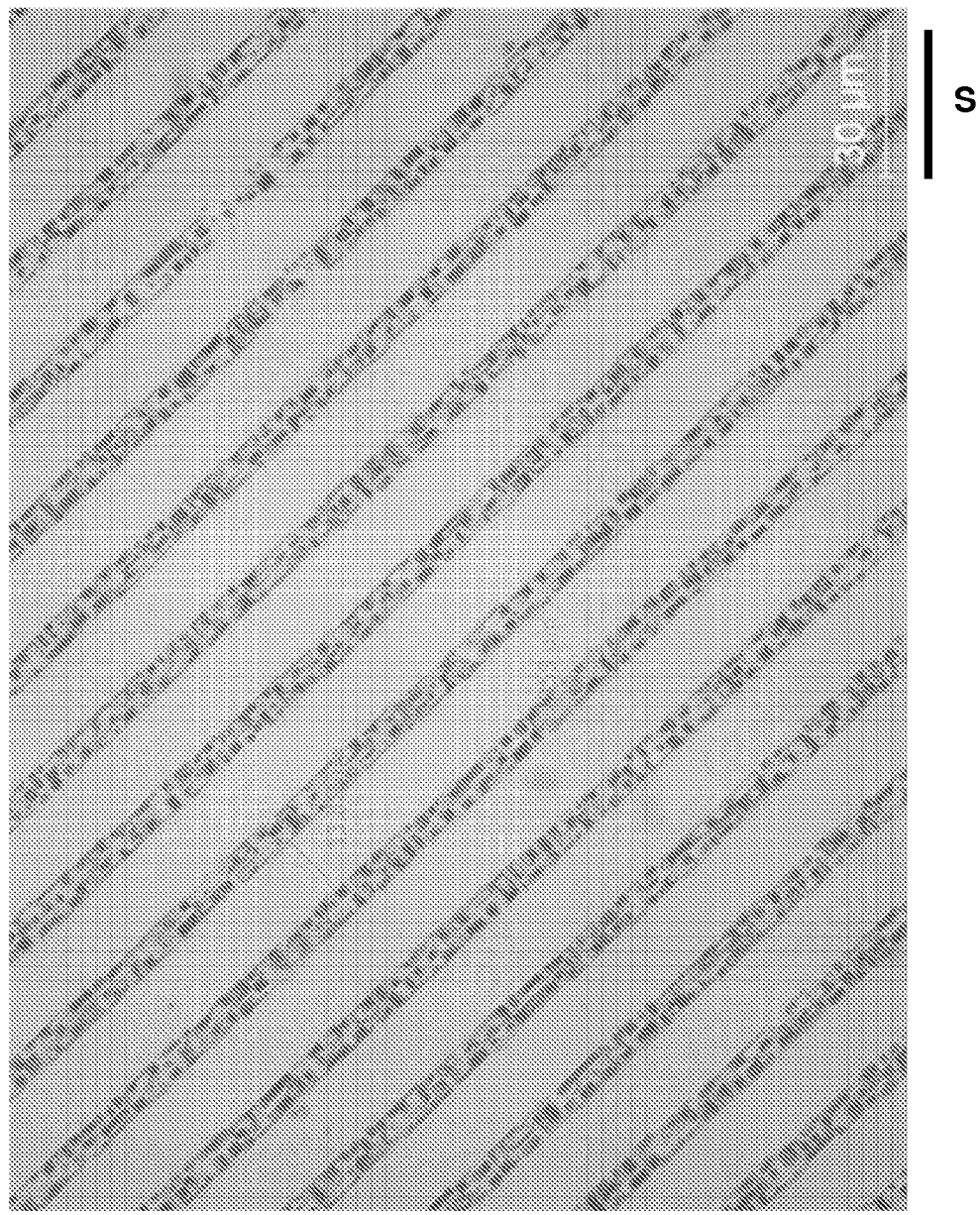
FIG. 4 is an optical microscope image of the structure in FIG. 3 after preferential anisotropic etching of the SCD surface and removal of any residual nickel. The lighter region is the un-etched, original SCD surface, and the darker regions represent the etched pyramid-shaped recesses. (Scale bar S is 30 μm and width of the pyramid-etched regions is about 7.5 μm.)
Figure 6:
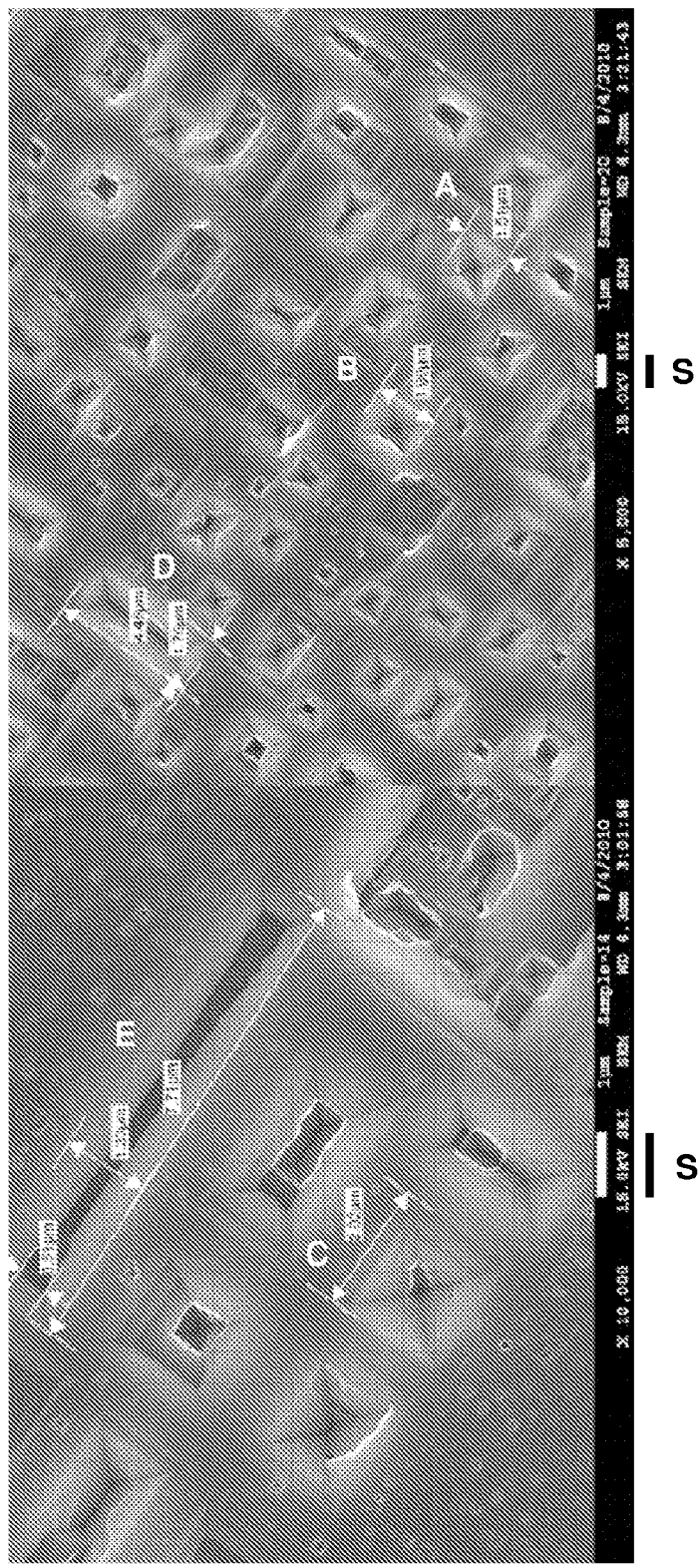

FIG. 6 includes SEM images of the preferentially anisotropically etched structure from FIG. 4 at lower (top image) and higher (bottom image) levels of magnification. Structures A-E illustrate differently shaped pyramidal recesses (substantially square, rectangular, full, partial). (Scale bar S is 1 μm for both images.)

Figure 7:
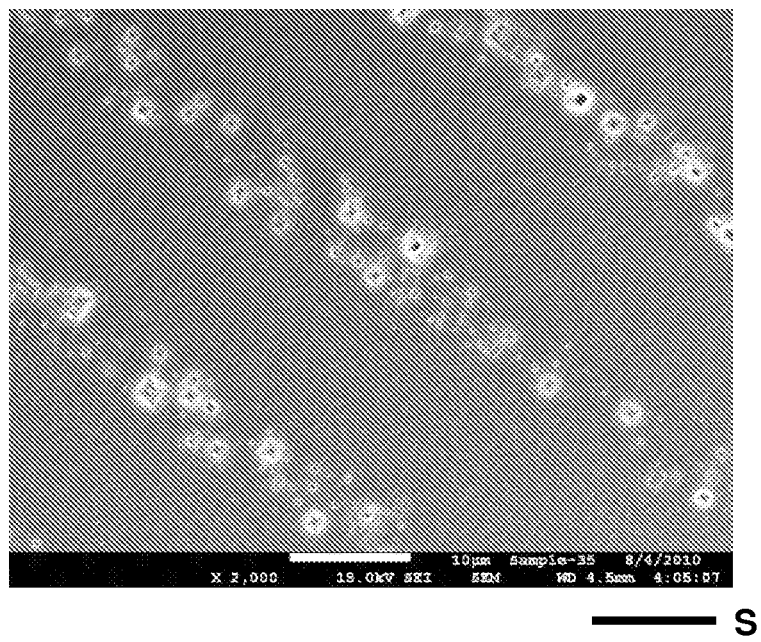

FIG. 7 is a SEM image of a (100) SCD surface after preferential etching with a nickel pattern (25 nm thickness) on top of the SCD surface. (Scale bar S is 10 μm.)

Figure 8:
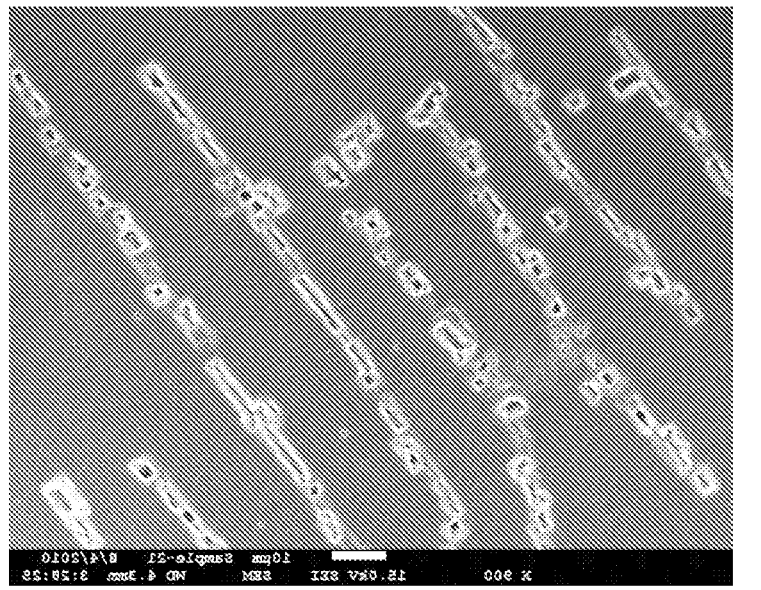

FIG. 8 is a SEM image of a (100) SCD surface after preferential etching with a nickel pattern (47 nm thickness) on top of the SCD surface. (Scale bar S is 10 μm.)

Figure 9A:
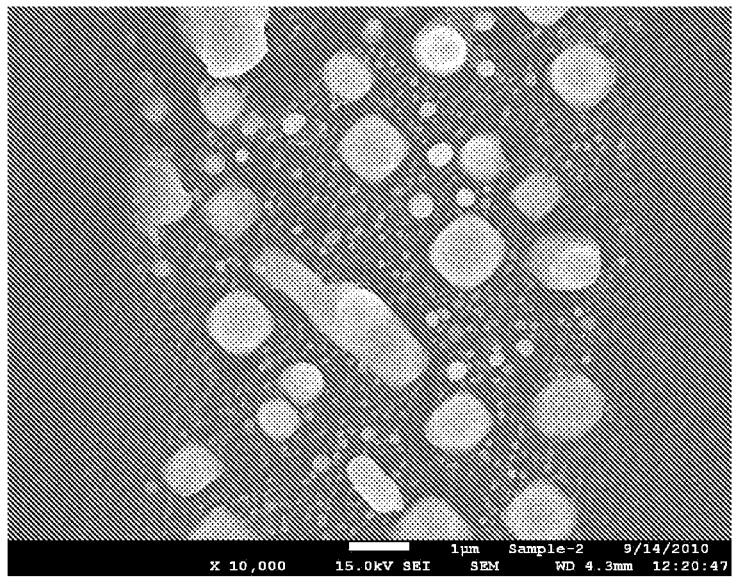
Figure 9B:
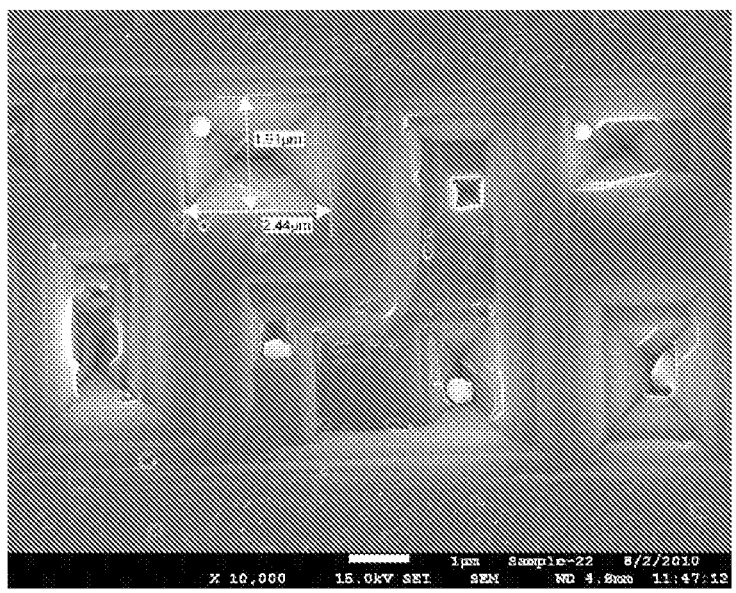

FIGS. 9A and 9B are SEM images of a (100) SCD surface after preferential etching with a nickel pattern (100 nm thickness) on the top of the SCD surface for 2 minutes (FIG. 9A) and 2 hours (FIG. 9B). (Scale bar S is 2 μm for each image.)

Figure 10:
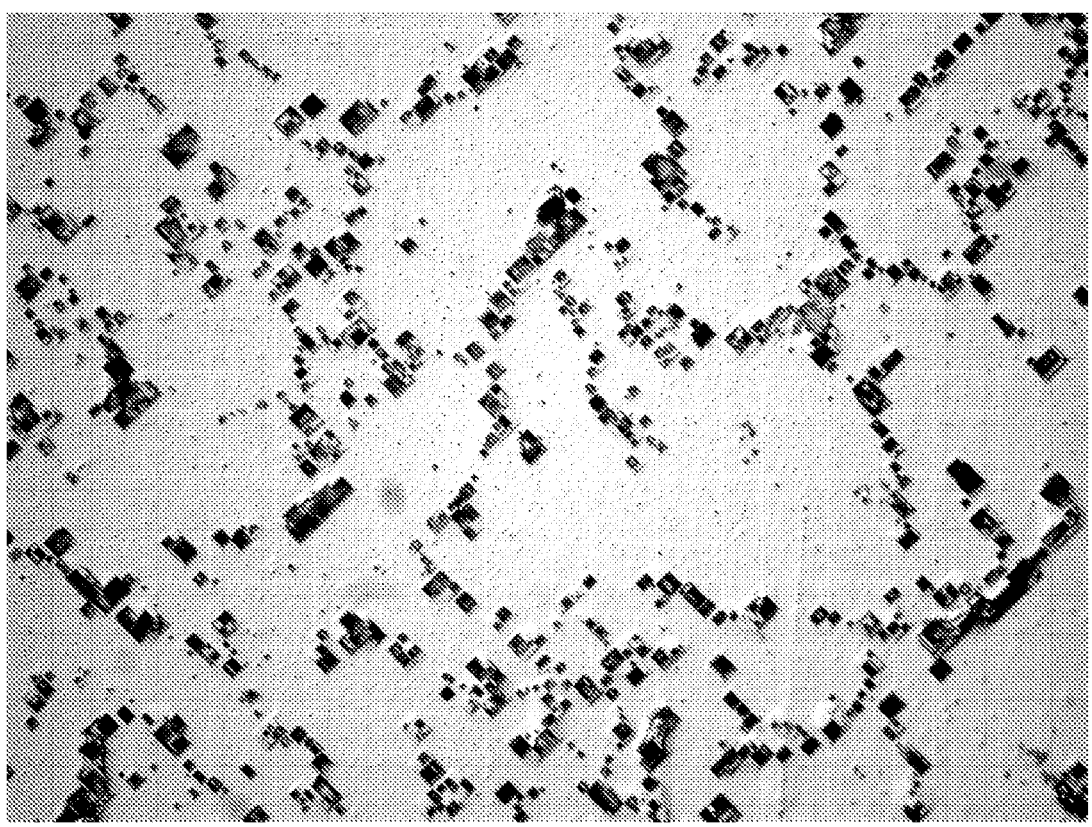

FIG. 10 is an optical microscope image (500× magnification) of a (100) diamond surface with randomly located preferential etch sites formed by the nickel catalyzed etching process.

Figure 11:
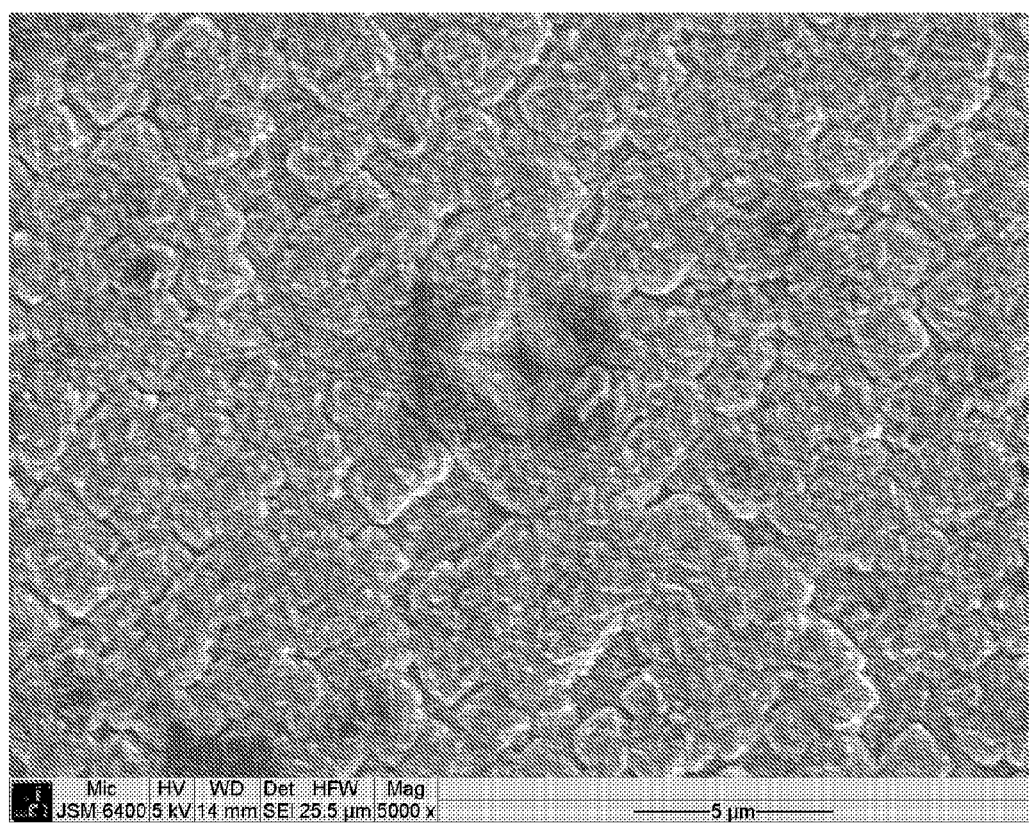

FIG. 11 is a SEM image of a (100) diamond surface after phosphorus doping deposition onto a preferentially etched substrate having inverted pyramidal recesses with (111) surfaces.

While the disclosed compositions, apparatus, products, and methods are susceptible of embodiments in various forms, specific embodiments of the disclosure are illustrated in the drawings (and will hereafter be described) with the understanding that the disclosure is intended to be illustrative, and is not intended to limit the claims to the specific embodiments described and illustrated herein.

DETAILED DESCRIPTION

The disclosure relates to the formation of n-doped single crystal diamond (SCD). In general, a SCD substrate is preferentially anisotropically etched to provide one or more recesses in the SCD substrate, where the recesses are defined by (111) surface sidewalls resulting from the preferential anisotropic etching process. N-type SCD (e.g., using a phosphorous dopant) is then deposited into the preferentially etched recesses at relatively high levels based on the (111) deposition surfaces. When the SCD substrate is a p-type diamond, the resulting structure can be used as a p-n junction, for example for use in various power electronic apparatus such as diodes, etc.

Figure 1:
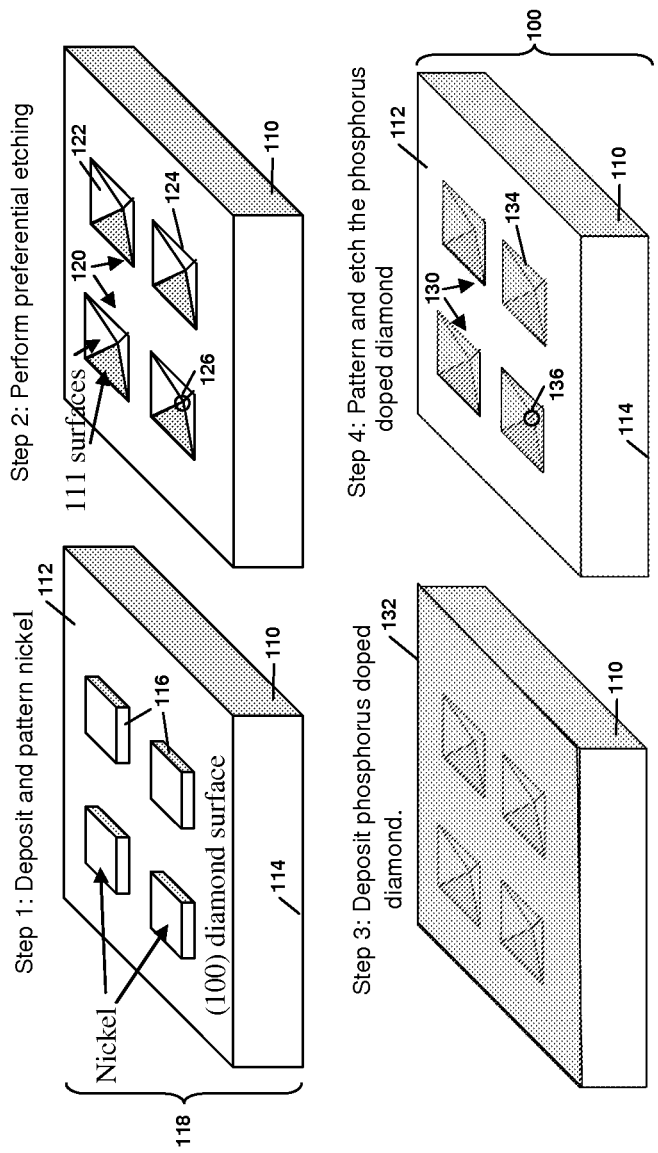
FIG. 1 illustrates a method of forming an n-doped single crystal diamond (SCD) structure according to the disclosure (top left: nickel-patterned SCD substrate; top right: preferentially etched SCD substrate; bottom left: n-doped diamond layer deposited over preferentially etched SCD substrate; bottom right: n-doped SCD substrate).

As illustrated in FIG. 1 and described in more detail below, a method for forming an n-doped single crystal diamond (SCD) structure 100 generally includes providing a SCD layer/substrate 110 having opposing surfaces 112, 114 (e.g., a top surface 112 and a bottom surface 114, where the top surface 112 can be a growth surface for homoepitaxial growth/deposition of additional SCD). A recess 120 is then preferentially anisotropically etched in the SCD layer 110 through the top/growth surface 112. The preferential etching process generally results in a plurality of recesses 120 (e.g., as illustrated in the examples below). Each recess 120 is defined by one or more (111) surface sidewalls 122 etched into the SCD layer 110 and has a base 124 defined by the intersection of the sidewalls 122 and the top/growth surface 112 of the SCD layer 110. N-doped SCD is deposited into the recess 120 (e.g., multiple or all of the formed recesses 120), thereby forming an n-doped SCD region 130 in the recess 120 and providing the n-doped SCD structure 100.

The formation of SCD according to the disclosure, whether for the formation of n-doped, p-doped, or undoped SCD, can be performed by the homoepitaxial growth of layers of SCD onto a substrate/seed (which may or may not form part of the ultimate desired SCD structure). Suitable substrate/seed materials can include a high-pressure, high-temperature ("HPHT") SCD seed or a SCD layer previously grown on and removed from an HPHT seed. Suitable deposition processes for SCD generally include chemical vapor deposition (CVD) processes, for example (microwave) plasma-assisted chemical vapor deposition (PACVD) processes. Example PACVD processes for the homoepitaxial growth of doped and undoped single crystal diamond can be found in U.S. Publication Nos. 2009/0239078 and 2010/0034984 (references 1 and 2 below), incorporated herein by reference in their entireties. The deposition of undoped SCD is suitably achieved with source gases including a carbon source such as $CH_4$ or other hydrocarbon, a hydrogen source such as $H_2$, and an optional diluent gas such as Ar. The deposition of doped diamond can be accomplished by adding dopants (e.g., a phosphorous source such as $PH_3$, a boron source such as $B_2H_6$, and an optional nitrogen source such as $N_2$ to increase deposition rates) to the deposition source gases, for example in the gas phase of the plasma discharge for a PACVD process (i.e., in addition to the hydrogen and carbon/hydrocarbon source gases). The feed composition of the source gases for doped or undoped diamond deposition can be suitably selected based on the desired deposition rate, the formation of diamond having a single crystal structure, the presence of one or more dopants, etc. For example, the feed gas can suitably include at least 0.1 mol. %, 0.2 mol. %, 0.5 mol. %, 1 mol. %, 2 mol. %, or 3 mol. % and/or up to 0.5 mol. %, 1 mol. %, 2 mol. %, 3 mol. %, 5 mol. %, 6 mol. %, 8 mol. %, or 10 mol. % of a carbon/hydrocarbon source such as $CH_4$ in hydrogen (or alternatively expressed as a volume fraction in hydrogen).

The processes for isotropic or anisotropic (e.g., other than the preferential anisotropic etching described herein that generates (111) sidewalls, for example those forming generally rectangular trench structures and/or vertical recess sidewalls relative to an etched substrate surface) patterning the SCD at various stages of the fabrication process (e.g., including patterning of n-doped, p-doped, or undoped SCD) can be similar to those used in microelectronics and microelectromechanical systems (MEMS) fabrication (e.g., etching/photolithography techniques) as well as conventional cutting, polishing, and planarization techniques. For example, the anisotropic patterning of the SCD can be performed using diamond plasma-assisted etching in combination with photolithography techniques. Suitable plasma-assisted etching techniques can include (i) the deposition of a hard mask material (e.g., Al, Ti, Au, $SiO_2$, $Si_3N_4$) onto a SCD substrate to be patterned, (ii) the patterning of the hard mask with a photoresist (e.g., patterned with liftoff and/or etching techniques), (iii) anisotropic etching of the exposed SCD substrate (e.g., anisotropic microwave plasma-assisted dry etching using $Ar/O_2$ etch gases with optional $SF_6$ for example to form a recesses with substantially vertical sidewalls and being patterned analogously to the hard mask), and (iv) removal of the hard mask. The Tran et al. publications (references 3 and 4 listed below) illustrate such plasma-assisted etching techniques and are incorporated herein by reference. The depth of the etching is controlled by how long the etching process is performed. Typical etch rates can vary from less than 1 to over 10 microns per hour for single crystal diamond.

Single Crystal Diamond Substrate

The SCD layer 110 can be any type of single crystal diamond, whether doped or undoped. Suitably, the SCD layer 110 includes a p-type dopant so that the resulting SCD structure 100 can be used as a p-n junction in an electronic device. A boron impurity in the SCD layer 110 can serve as the p-type dopant, for example being derived from a dopant source such as diborane, trimethylborane (TMB), and solid boron. Suitable boron doping levels generally range from at least $10^{14}/cm^3$ and/or up to $10^{21}/cm^3$ (expressed as the number of dopant atoms incorporated into the SCD lattice structure per unit volume). P-type diamond deposition (see reference 5 and references therein) can be performed using concentrations of diborane (or other boron source) in the feedgas of the microwave PACVD deposition system that gives boron doping concentrations in diamond at the desired level (e.g., from $10^{14}/cm^3$ to over $10^{20}/cm^3$). The dopant level (e.g., boron level) can be varied depending on the intended use of the structure, for example: (a) p⁻-type SCD generally has a dopant concentration of $10^{16}/cm^3$ or less (b) p-type SCD generally has a dopant concentration ranging from $10^{16}/cm^3$ to $10^{19}/cm^3$ and (c) p⁺-type SCD generally has a dopant concentration of $10^{19}/cm^3$ or more. Low (p⁻) and medium (p) doping levels are suitable for the SCD layer 110 substrate when the SCD structure 100 is to serve as a p-n junction. Heavily-doped boron diamond (p⁺) can be used to make ohmic contacts to the p-type region (e.g., as illustrated by the layer 200 in FIG. 2). Lower doping levels (e.g., $10^{14}/cm^3$ to $10^{17}/cm^3$) can be obtained by reducing the dopant/impurity feedgas flow rate. For the lowest levels of boron doping (e.g., about $10^{16}/cm^3$ or less), oxygen can be added to the deposition feedgas, because oxygen addition reduces the boron incorporation level in the diamond at the lower levels.

The SCD layer 110 is suitably oriented such that the top surface/growth surface 112 is a (100) crystal surface (e.g., to facilitate the rapid growth/formation of a high-quality SCD layer 110 on another SCD surface or seed and/or to facilitate the formation of regularly shaped pyramidal recesses 120 in the SCD layer 110). However, the top/growth surface 112 can be preferentially anisotropically etched and have n-doped SCD deposited therein/thereon with a crystal surface other than a (100) surface for the top/growth surface 112. For example, the top/growth surface 112 can be a (110) surface that can be preferentially etched according to the method described herein and still yield distorted pyramidal recesses with (111) surface sidewalls.

Preferential Anisotropic Etching of Single Crystal Diamond

The preferential anisotropic etching of the SCD layer 110 can be performed using the metal-based preferential etching process for single crystal diamond as described by Smirnov et al. (reference 6 below; incorporated herein by reference in its entirety). The process generally uses a metal (e.g., nickel or iron) patterned into nano/micro-size structures on a diamond surface (e.g., a (100) SCD surface). The diamond is then etched with the metal present on the diamond surface in the presence of a hydrogen source at an elevated temperature. The resulting etching pattern includes inverted pyramids in the diamond surface with (111) surfaces exposed that define the boundaries of the etched recesses. As used herein, preferential anisotropic etching (or preferential etching) includes an anisotropic etching process that preferentially yields a (111) exposed surface upon etching of a substrate surface, whether a (100) surface or otherwise. This is compared with other anisotropic etching techniques that do not generally isotropically etch a substrate with equal rates in all directions (e.g., anisotropic techniques tending to create vertical sidewalls and/or rectangular trench structures), but that do not preferentially yield (111) surfaces independent of the starting substrate surface. The etch rate of the (100) surface with this preferential etching process is about 100 times faster than that of the (111) surface. More specifically, the metal apparently catalyzes the reaction of carbon etching or removal on the (100) surface faster than on the (111) surface (e.g., selective reaction of carbon with hydrogen from the hydrogen source to form and subsequently desorb $CH_x$ reaction products).

With reference to FIG. 1, the preferential anisotropic etching process includes first depositing a patterned metal layer 116 over the growth surface 112 of the SCD layer 110 to form a metal-patterned SCD substrate 118. The patterned metal layer 116 has a shape corresponding to a surface region to be preferentially etched to form one or more recesses therein. The patterned metal layer 116 can have any desired thickness (e.g., 20 nm to 200 nm, 50 nm to 150 nm), and a relatively thicker layer can be selected to result in a higher fraction of surface area for the eventual patterned recesses 120 relative to that of the patterned metal layer 116. The patterned metal layer 116 can be formed with conventional techniques, for example by depositing a metal layer (not shown) over the growth surface 112 of the SCD layer 110 (e.g., by thermal evaporation or sputtering) and then patterning the deposited metal layer (e.g., by normal photolithography/etching using a patterned photoresist to protect metal in the pattern locations from the acid metal etch solution prior to removal of the patterned photoresist).

The metal-patterned SCD substrate 118 is then exposed to a hydrogen source at a sufficiently high temperature to preferentially anisotropically remove SCD material from the SCD layer 110 under the patterned metal layer 116, thereby forming the sidewalls 122 and the recess 120. Exposure of the metal-patterned SCD substrate 118 to a hydrogen source can be performed by any suitable method, for example by exposing the metal-patterned SCD substrate 118 to a hydrogen plasma or by annealing the metal-patterned SCD substrate 118 in a hydrogen atmosphere. A suitable etching time generally relates to the thickness of the patterned metal layer 116 (e.g., where thicker layers can require longer times; such as 1 minute to 6 hours, 30 minutes to 4 hours, or 1 hour to 3 hours). Hydrogen ($H_2$) gas is a suitable hydrogen source, and the exposure can be performed at atmosphere or substrate temperatures ranging from 500° C. to 1400° C. (e.g., at least 500° C., 600° C., 700° C., or 800° C. and/or up to 900° C., 1000° C., 1100° C., 1200° C., 1300° C., 1400° C., or the evaporation point of the metal).

Once the recesses 120 are formed, residual metal may remain in the formed recesses 120 and/or on unetched portions of the SCD layer 110 that were under the patterned metal layer 116 prior to etching. Accordingly, the residual metal remaining in the recesses 120 and/or on the growth surface 112 can be removed with a cleaning step (e.g., sulfuric acid/nitric acid clean, hydrochloric acid clean, ammonium hydroxide clean, acetone clean, and methanol clean, in order).

In general (and in particular when the growth surface 112 of the SCD layer 110 is a (100) surface), the recess 120 has a full 120A or partial 120B (see FIG. 2) pyramidal shape (or a combination of different pyramidal shapes when there are a plurality of recesses 120) with the base 124 of the recess 120 corresponding to the base 124 of the pyramidal shape and being substantially coplanar with the growth surface 112 of the SCD layer 110. The recess 120 and the corresponding pyramidal shape are defined by four adjacent (111) surface sidewalls 122 resulting from the preferential anisotropic etching process. The full pyramidal shape 120A includes an apex 126 opposing the base 124 and being defined by the intersection of the recess sidewalls 122 at an (originally) interior location of the SCD layer 110. The partial pyramidal shape 120B includes a top surface 128 opposing the base 124 (i.e., a "top" surface relative to the pyramid base but illustrated as a lower or bottom surface in FIG. 2) and being defined by a (100) surface wall 128 etched into the SCD layer 100 and intersected by the recess sidewalls 122 at an (originally) interior location of the SCD layer 110. The base 124 of the pyramidal shape/recess 120 is rectangular (e.g., square (aspect ratio≈1), non-square (aspect ratio≠1)) regardless of whether the recess 120 has the full 120A or partial 120B pyramidal shape. As illustrated in FIG. 1, the patterned metal layer 116 has a rectangular shape that is aligned with the base 124 of the eventual recess 120. In general, however, the rectangular pyramid base 124 and recess 120 will be aligned with the (111) surfaces internal to the SCD layer 110 and independent of the particular shape/orientation of the patterned metal layer 116 on the SCD layer 110.

Figure 1A:
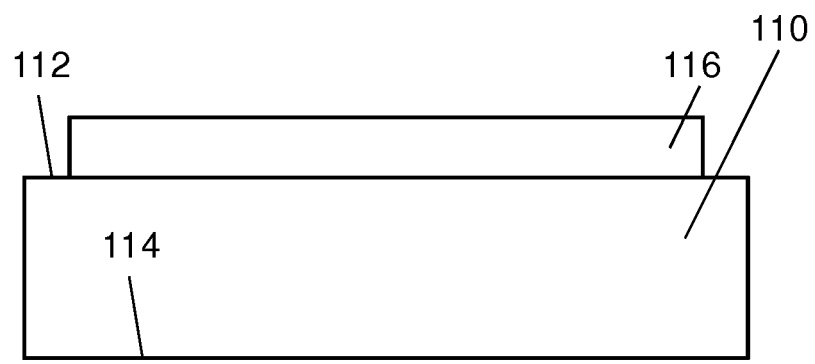
FIG. 1A illustrates an embodiment of the method of FIG. 1 in which preferentially etched recesses are randomly sized and positioned (top: nickel-patterned SCD substrate; middle: preferentially etched SCD substrate; bottom: n-doped SCD substrate).
Figure 1A:
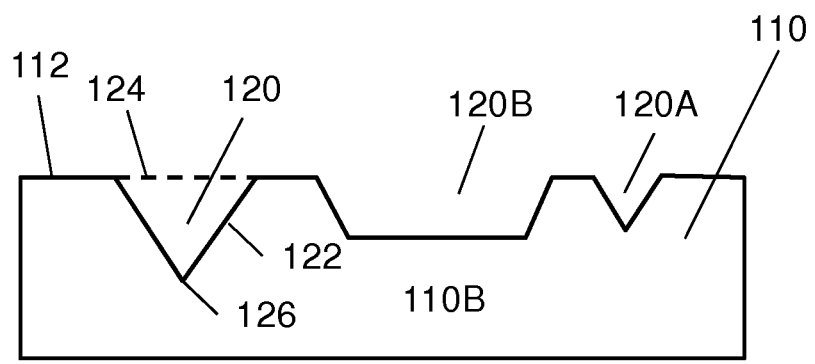
Figure 1A:
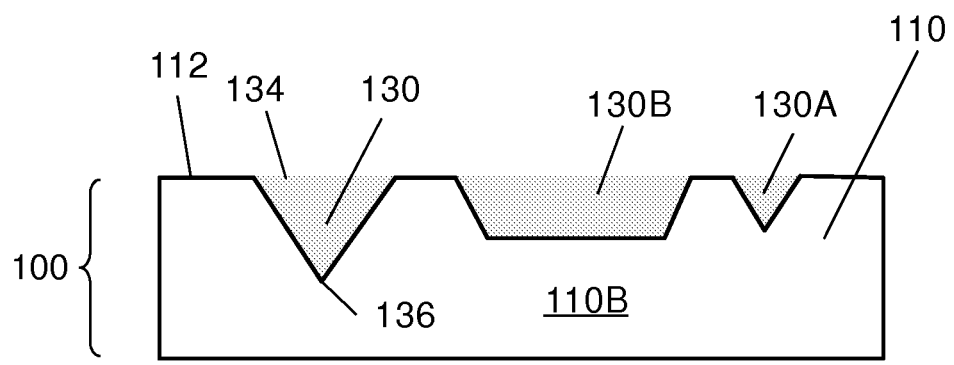

As illustrated in FIG. 1, the patterned metal layer 116 includes a plurality of rectangular/square metal layers that correspond to the shape of the base 124 for the ultimately formed pyramidal recesses 120. In general, however, a particular shape/orientation for the patterned metal layer 116 results in a plurality of randomly sized and positioned recesses 120 that are beneath the original patterned metal layer 116 and that are aligned with the (111) internal surfaces of the SCD layer 110. This feature of the preferential etching method is illustrated in FIG. 1A as well as in FIGS. 3-9 related to Example 1 below. FIG. 1A illustrates the cross section of the SCD substrate 110 with the patterned nickel layer 116 (top). After preferential etching, three recesses 120 with (111) sidewalls 122 are shown as being formed in a remaining bulk SCD region 110B of the SCD layer 110 (middle of FIG. 1), including two full pyramidal-shaped recesses 120A and a one partial pyramidal-shaped recess 120B. Although not shown in the cross section of FIG. 1A, the bases 124 of the recesses 120 can have a generally square or rectangular shape. The bottom portion of FIG. 1A shows the patterned SCD substrate 110 after deposition of the n-doped SCD regions 130 into the recesses 120 and adjacent to the bulk SCD region 110B (described below). The bottom portion of FIG. 1A would be after removal of some of the phosphorus doped diamond (by polishing for example) to get a planar surface. The edges of the base 124 for the pyramidal recesses 120 can have a length of at least 0.001 μm, 0.01 μm, 0.02 μm, 0.05 μm, 0.1 μm, 0.2 μm, 0.3 μm, 0.5 μm, or 1 μm and/or up to 0.02 μm, 0.05 μm, 0.1 μm, 0.2 μm, 0.3 μm, 0.5 μm, 1 μm, 2 μm, 3 μm, 5 μm, 8 μm, or 10 μm (i.e., where two adjacent edges are substantially the same for a square base 124 and are different for a non-square base 124). Thus, in some embodiments, some or substantially all of the pyramidal recesses 120 or corresponding n-doped SCD regions 130 in an area of the patterned SCD substrate 110 can have characteristic dimensions/edge lengths on the nanoscale (e.g., between 1 nm-1000 nm; 10-100 nm, 200 nm, or 500 nm) regardless of whether the recesses 120 or regions 130 are randomly positioned. Smaller recesses 120 and regions 130 can be obtained by varying the preferential etch conditions (e.g., thinner nickel or other metal pattern layer; variable etch time, temperature, or gas; such as illustrated in FIGS. 7 and 9A of the examples). Additionally or alternatively, the base 124 can be characterized according to the aspect ratio of its rectangular shape (i.e., long side length relative to the short side length). The aspect ratio of the base 124 can range from 1 (i.e., a square) or more than 1 (i.e., a non-square rectangle) up to any value greater than one, such as 1.5, 2, 3, 5, 7, 10, or 20, for example as applied to an individual base 124 or a plurality of bases 124 (e.g., representing the breadth of the shape distribution for the plurality, such as where the upper end of a breadth distribution for a plurality can reflect the presence of at least some recesses in the plurality having an aspect ratio at or above the upper end). When the length scale of the patterned metal layer 116 is large compared to the base edge length(s) (e.g., a minimum length scale of at least 5 μm, 8 μm, 10 μm, or 20 μm), the plurality of randomly sized and positioned recesses 120 are generally obtained. Suitably, the surface area of the bases 124 for the plurality of recesses 120 is at least 10%, 20%, 30,%, 40%, 50%, or 60% and/or up to 50%, 60%, 70%, 80%, or 90% of the original surface area of the patterned metal layer 116 (i.e., alternatively expressed as a relative surface area or recess surface density). Use of substantially smaller patterned metal layers 116 (e.g., at least 0.01 μm, 0.02 μm, 0.05 μm, 0.1 μm, 0.2 μm, or 0.5 μm and/or up to 0.5 μm, 1 μm, 2 μm, 3 μm, or 5 μm) may permit the positional/size control of the resulting recesses 120 with a shape corresponding to that of the patterned metal layers 116.

Formation of n-Doped Single Crystal Diamond

FIGS. 1 and 1A illustrate a particular method for forming the n-doped SCD region 130. Specifically, an n-doped SCD 132 layer is deposited over the SCD layer 110 growth surface 112 and in the recess(es) 120. At least a portion of the deposited n-doped SCD layer 132 is then removed from SCD layer growth surface 112 while leaving the deposited n-doped SCD layer 132 in the recess 120 to form the n-doped SCD region 130 in the recess 120, for example using a polishing and/or an etching process as described above. As a result of the etching/polishing removal of n-doped SCD, the resulting n-doped SCD region 130 can have a top surface 134 that is substantially coplanar with the top/growth surface 112 of the SCD layer 110 (e.g., and also have the same crystal surface as the top/growth surface 112, for example a (100) surface).

Similar to the above boron/p-type doping process, n-doped SCD can be deposited using a CVD process (e.g., PACVD) with a carbon source such as $CH_4$ or other hydrocarbon, with a hydrogen source such as $H_2$, with a n-type dopant or phosphorous source such as $PH_3$, and with an optional diluent or other dopant gas. The phosphorus is expected to be highly incorporated on the (111) surface sidewalls 122 of the recess 120 as compared to the growth surface 112 (e.g., (100) surface) of the SCD layer 110. The phosphorous dopant in the n-doped SCD in the recess 120 is suitably incorporated at a level of at least $10^{18}/cm^3$, $10^{19}/cm^3$, or $10^{20}/cm^3$ and/or up to $10^{21}/cm^3$ or $10^{22}/cm^3$. Phosphine ($PH_3$) or other phosphorous source suitably can be diluted in hydrogen to 1-10000 ppm (e.g., at least 1 ppm, 2 ppm, 5 ppm, 10 ppm, 20 ppm, 50 ppm, 100 ppm, or 200 ppm and/or up to 20 ppm, 50 ppm, 100 ppm, 200 ppm, 500 ppm, 1000 ppm, or 10,000 ppm; such as 10-25 ppm or 1-100 ppm) levels for use as a source gas (e.g., where ppm represents a mole or volume fraction of the phosphorous source in hydrogen). The phosphorus dopant goes into the diamond with an energy level of 0.58 eV below the conduction band. Other n-type dopants are possible, including (1) nitrogen which can go into the diamond lattice substitutionally but with a very high activation energy of 1.7 eV, (2) a boron-oxygen complex, however this complex is not stable at higher temperatures, (3) a group IA element such as lithium or sodium, (4) a group VB group element such as arsenic (e.g., in addition to phosphorous), (5) a group VIB element such as sulfur or selenium, and (6) a group VIIB element such as chlorine. Even though p-type and n-type SCD can be deposited using a microwave plasma reactor to perform PACVD, it is desirable to use two separate microwave plasma reactors to eliminate the potential of dopant cross-contamination in the reactor feed gas supply lines or deposition chamber (e.g., p-type SCD is deposited in a first reactor with a boron or other p-type dopant feed line and n-type SCD is deposited in a second reactor with a phosphorous or other n-type dopant feed line).

Suitably, the concentration ratio in the feed gas of the n-type dopant relative to that of the carbon source (e.g., a ratio of $[PH_3]/[CH_4]$ in the feed) is relatively high to promote a higher level of incorporation of the dopant into the n-doped SCD 130, albeit potentially resulting in a lower growth rate of the n-doped SCD layer 130 during deposition (e.g., with representative growth rates of n-type SCD such as 0.1 µm/h-5 µm/h or 0.25 µm/h-2.5 µm/h). Suitable ratios (e.g., volumetric or molar ratios of the source gases or their equivalent in terms of source atoms such as C or P) can be at least 0.05, 0.1, 0.2, 0.3, 0.5 and/or up to 0.1, 0.2, 0.3, 0.5, 1, or 2. Deposition times for the formation of n-doped SCD 130 generally relate to the deposition rate and the size/depth of the recesses 120, and can range from 10 minutes to 8 hours, 30 minutes to 4 hours, or 1 hour to 3 hours.

Related Apparatus and Products

The n-doped SCD structure 100 generally resulting from any of the various embodiments of the foregoing methods is illustrated in the final panels of FIGS. 1 and 1A. As before, the SCD layer 110 has a top/growth (e.g., (100)) surface 112 and a bottom surface 114. The SCD layer 110 includes a recess region 120 defined by one or more (111) surface sidewall planes 122 in the SCD layer 110 that intersect the top surface 112 thereof. The recess region 120 further includes a base 124 defined by the intersection of the sidewall planes 122 and the top surface 112 of the SCD layer 110. As shown in FIG. 1A, the SCD layer 110 can include a plurality of recess regions 120, including full and/or partial pyramidal recesses 120A, 120B. The plurality of regions 120 can be randomly positioned (e.g., in a preselected area of the SCD layer 110 such as that corresponding to an original nickel or other metal etch pattern thereon) and/or randomly shaped or sized (e.g., having rectangular pyramidal bases 124 with varying aspect ratios or edge lengths). The SCD structure 100 further includes an n-doped SCD region 130 with a top surface 134 and an internal boundary between the SCD layer 110 and the n-doped SCD region 130 defined by the sidewall planes 122 of the recess region 120. As shown in FIG. 1A, the SCD structure 100 can include a plurality of the n-doped SCD regions 130 that are positioned, shaped, and/or sized correspondingly to a complementary recess region 120 (e.g., internal sidewall surfaces of an n-doped SCD region 130 are the same as or otherwise represent the internal boundary/interface between the sidewall planes 122 of the corresponding recess region 120). Alternatively or additionally, the SCD layer can be characterized as including a bulk SCD region 110B (e.g., representing the remainder of the original SCD layer 100 after preferential etching) and a plurality of randomly positioned, shapes, and/or sized n-doped SCD regions 130 distributed throughout the SCD layer 110 and adjacent the bulk SCD region 110B. Each n-doped SCD region 130 can have the full or partial inverted pyramid shape with (a) a base corresponding to the top surface 112 of the SCD layer 110 (e.g., the base or top surface of the n-doped SCD region 130 can be oriented on the same side of the SCD layer 110 as the top surface 112 and optionally can be coplanar therewith) and (b) sidewall surfaces corresponding to the interface between the n-doped SCD region 130 and the bulk SCD layer 110B, and being aligned along (111) planes in the SCD layer. The SCD layer 110, the bulk SCD region 110B, and the n-doped SCD region(s) 130 share the same single crystal structure; the slight change in nomenclature relative to the foregoing description of the processing method is due to the fact that there is no physical trace of the original recess sidewalls 122 in the final SCD structure 100 and that the original locations of the recess sidewalls 122 simply define (111) surface planes on one side of which the SCD lattice is n-type (e.g., phosphorous-doped) and on the other side of which the SCD lattice is p-type (e.g., boron-doped), undoped, or even n-type with a different dopant type and/or concentration relative to that in the n-doped SCD region 130. Alternatively or additionally, the internal boundaries between the n-doped SCD regions 130 and the surrounding SCD layer 100 or SCD bulk region 110B are further defined by a discontinuity in the concentration of an n-type dopant in the n-doped SCD regions 130 and in the surrounding SCD layer 110 or SCD bulk region 110B across the sidewall planes of the corresponding recess region 120 or the n-doped SCD regions 130. For example, the concentration profile of the n-type dopant can essentially exhibit a step change at the internal boundary when examined along a line passing from the n-doped SCD region 130 to the surrounding SCD layer 110 or SCD bulk region 110B (e.g., from a high n-type dopant concentration to a low or zero concentration across the boundary).

Analogous to the previously described recess 120, the n-doped SCD region 130 can have a full 130A or partial 130B pyramidal shape (see FIG. 2 and FIG. 1A) with the top surface 134 of the n-doped SCD region 130 corresponding to the base of the pyramidal shape and suitably being substantially coplanar with the top surface 112 of the SCD layer 110. The top surface 134 of the n-doped SCD region 130 can be rectangular (e.g., square/non-square). The n-doped SCD region 130 can have the full pyramidal shape 130A with an apex 136 opposing the base/top surface 134 and being defined by the intersection of the sidewall planes 122. Alternatively, the n-doped SCD region 130 has the partial pyramidal shape 130B with a bottom surface 138 opposing the base/top surface 134 and being defined by a (100) surface plane 128 internal to the SCD layer 110 and intersected by the sidewall planes 122. This partially etched inverted pyramid could have a reduced focusing of the electric field in a composite diode structure that may lead to a lower breakdown voltage compared to the case of full pyramid shapes.

The SCD structure 100 can be incorporated into any of a variety of electronic devices. In particular, when the SCD layer 110 is p-doped, the combination of the SCD layer 110 and the n-doped SCD region(s) 130 forms a p-n junction. Such p-n junctions can be used in different combinations and structures, and can be incorporated into a number of devices such as a p-n junction diode, a bipolar transistor, a part of an insulated gate bipolar transistor (IGBT), among others.

Figure 2:
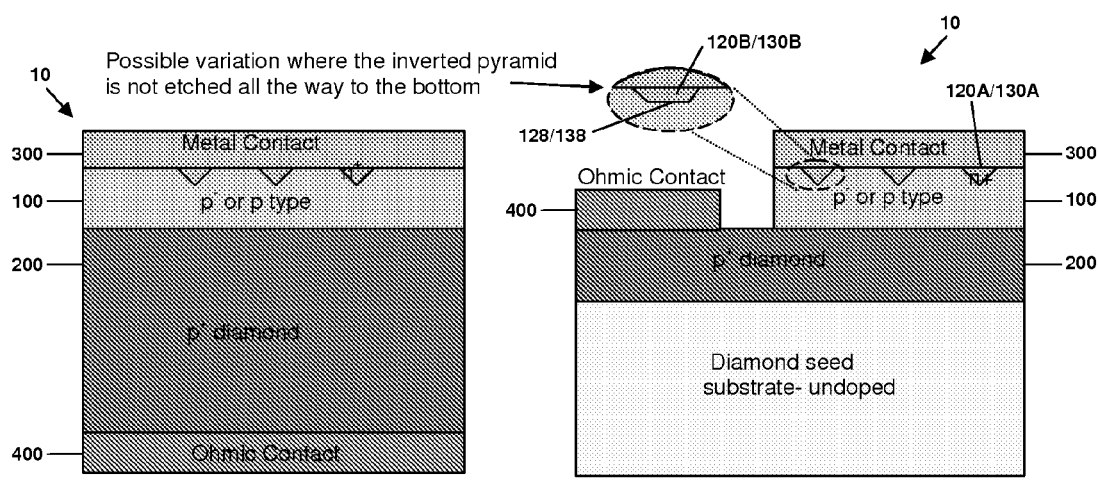
FIG. 2 illustrates two diode structures (left: vertical diode; right: pseudo vertical diode) incorporating an embodiment of the disclosure in which the n-doped SCD structure is in the form of a p-n junction.

Two diodes 10 are illustrated in FIG. 2 in which the SCD structure 100 is a p-n junction, but otherwise can conform to any of the variously described embodiments. The SCD structure 100 serves as a main diode region across which the applied diode voltage is maintained. The diodes 10 generally include a $p^+$-type SCD layer 200 on a bottom surface 114 of the n-doped SCD structure 100, a metal contact layer 300 on a top surface 112 of the n-doped SCD structure 100 and in contact with both the n-doped SCD region 130 and the SCD layer 110 top surface 112, an ohmic contact layer 400 on a surface of the $p^+$-type SCD layer 200. The merged pn/Schottky junction is formed with the metal Schottky contact 300 and a plurality of n-doped regions 130 in the SCD structure 100. Various metals can be used for making the Schottky metal contact 300, for example including molybdenum, aluminum, ruthenium, titanium, gold, and platinum. The individual n-doped regions 130 are spaced apart so that under reverse bias the width of the n+p depletion region from each n-doped region 130 connects with adjacent n-doped regions 130 to form a depletion region that extends down across the lightly doped p-type region (i.e., SCD layer 110) with increasing reverse bias. The spacing of the n-doped regions 130 can be selected based on the p- or p doping level and suitably can be calculated based on the width of the p-n junction depletion layer. The left drawing in FIG. 2 illustrates an embodiment of the diode 10 in which the ohmic contact layer 400 is on a bottom surface of the p+-type SCD layer 200 and opposes the n-doped SCD structure 100. The right drawing in FIG. 2 illustrates an alternative embodiment of the diode 10 in which the ohmic contact layer 400 is on the same surface of the p+-type SCD layer 200 as the n-doped SCD structure 100 and is isolated from the n-doped SCD structure 100.

Ohmic contacts can be made using a Ti/Au or Ti/Pt/Au stack that is now commonly adopted for making diamond contacts. The ohmic contacts are made to the diamond using either a heavily-doped p+ region (e.g., the SCD layer 200) or n+ region (e.g., the n-doped regions 130) in the diamond. The ohmic contacts are formed by depositing and patterning the metal for the contact and then annealing the contact so that the Ti forms a carbide layer.

The diodes 10 can be fabricated using a combination of conventional processing methods and the methods disclosed herein. For the left structure of FIG. 2, diode fabrication begins by growing a thick heavily p-type doped diamond on a single crystal substrate. Then, the thick p-type doped layer (e.g., on the order of hundreds of microns thick, such as about 100 µm to 500 µm) is removed from the seed substrate and then polished/prepared as the SCD layer 200 which acts as a substrate (e.g., with a (100) exposed top growth surface) for subsequent growth of a lightly doped p-type layer (i.e., the SCD layer 110) followed by the n+ layer (i.e., the n-type SCD regions 130) and contact layers 300, 400. For the right structure of FIG. 2, a pseudo-vertical structure can be fabricated by growing the heavily p-type SCD layer 200 on an undoped SCD seed or substrate (e.g., on a (100) surface thereof). The SCD structure 100, metal contact layer 300, and ohmic contact 400 are then sequentially formed on the same side of the SCD layer 200, for example using the disclosed etching process to isolate the ohmic contact 400 from the SCD structure 100/metal contact layer 300 stack.

EXAMPLES

The following example illustrates an embodiment of the disclosed methods, but is not intended to limit the scope of any claims thereto.

In the examples, a microwave plasma reactor as disclosed in U.S. Publication No. 2010/0034984 was used for diamond deposition and preferential etching. The portions of the system that are touched by the plasma discharge (e.g., fused silica dome, substrate holder, fused silica tube, the lower portion of the baseplate) were replaced with new components to avoid cross-contamination of a phosphorous doping process with residual components from a previous, unrelated process (e.g., boron dopants for the deposition of p-type diamond).

Example 1

Preferential Anisotropic Etching of SCD Substrate

FIGS. 3-6 illustrate a preferential anisotropic etching process for forming a plurality of pyramidal shaped recesses in an undoped SCD substrate according to the disclosure (i.e., the undoped SCD substrate illustrates the preferential etching process, but a p-doped SCD substrate alternatively could be used if a p-n junction according to the disclosure were to be formed).

The substrates used in this example are single crystal diamond pieces having approximate dimensions of 3.5 mm (H)× 3.5 mm (W)×1.5 mm (T). The substrates have a (100) face as the upper surface. They were obtained from Sumitomo (Osaka, Japan) and they were grown using a high-pressure high-temperature (HPHT) diamond forming process. Prior to use, they were cleaned with a boiling acid process. A nickel layer was then deposited on top of the cleaned (100) surface using a sputtering process. The nickel deposition was performed using magnetron sputtering physical vapor deposition to produce a thin layer of nickel on the top surface of the diamond. The thickness of the nickel was investigated across a thickness range from 20-100 nm. The nickel was patterned using photolithography and a nickel etching process.

Figure 3:
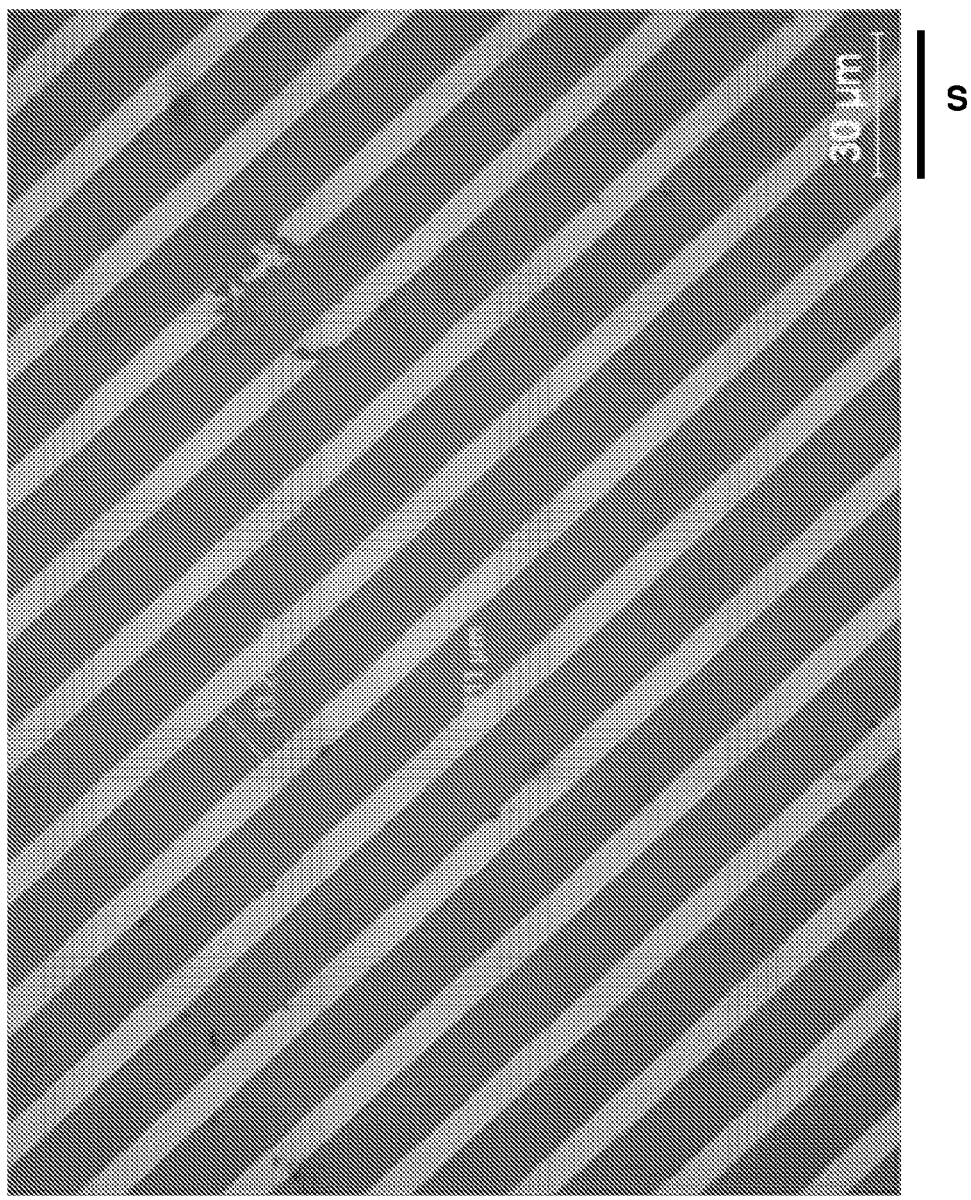
FIG. 3 is an optical microscope image of a SCD surface (darker region) with a nickel pattern (102 nm thickness) on top of the SCD surface (lighter region). The image illustrates the SCD/nickel surface prior to any preferential anisotropic etching. (Scale bar S is 30 μm and width of the nickel strips is about 7.5 μm.)

FIG. 3 is an optical microscope image of a SCD substrate surface (darker region) with a nickel pattern on top of the SCD surface (lighter region). Nickel was deposited onto the (100) surface of the SCD substrate with a thickness of about 100 nm and then patterned to provide the illustrated parallel nickel strips having a width of about 6 µm to about 8 µm, with adjacent strips being separated by about 12 µm to about 15 µm (more specifically estimated to be about 6.3 µm and about 13.3 µm, respectively, for the two widths indicated in the figure). The illustrated lines are aligned approximately along the [110] direction.

FIG. 4 is an optical microscope image of the structure in FIG. 3 after preferential anisotropic etching of the SCD surface and removal of any residual nickel. The preferential etching was performed by hydrogen plasma processing for 2 hours at 160 Torr. A microwave plasma was used to create the plasma with a hydrogen flow rate of 400 sccm and an input microwave power of 2 kW. The SCD substrate temperature during the etching process was 950° C. The nickel on the surface leads to etching of the surface at a rate that is higher for the (100) surface than the (111) surface, with the result being pyramid-shaped recesses etched into the substrate. Regions where nickel was present during the etching have several randomly positioned inverted pyramids with sizes in the range of a fraction of a micron in size to multiple micrometers in size. Some of the inverted pyramids are square and some are elongated in a rectangular shape with aspect ratios up to about 5:1 or more. The edges of the pyramids are aligned along the [110] direction on the (100) surface of the single crystal diamond. In the figure, the lighter region is the un-etched, original SCD surface (i.e., a (100) surface), and the darker regions represent the etched pyramid-shaped recesses (i.e., having (111) surface sidewalls).

Figure 5:
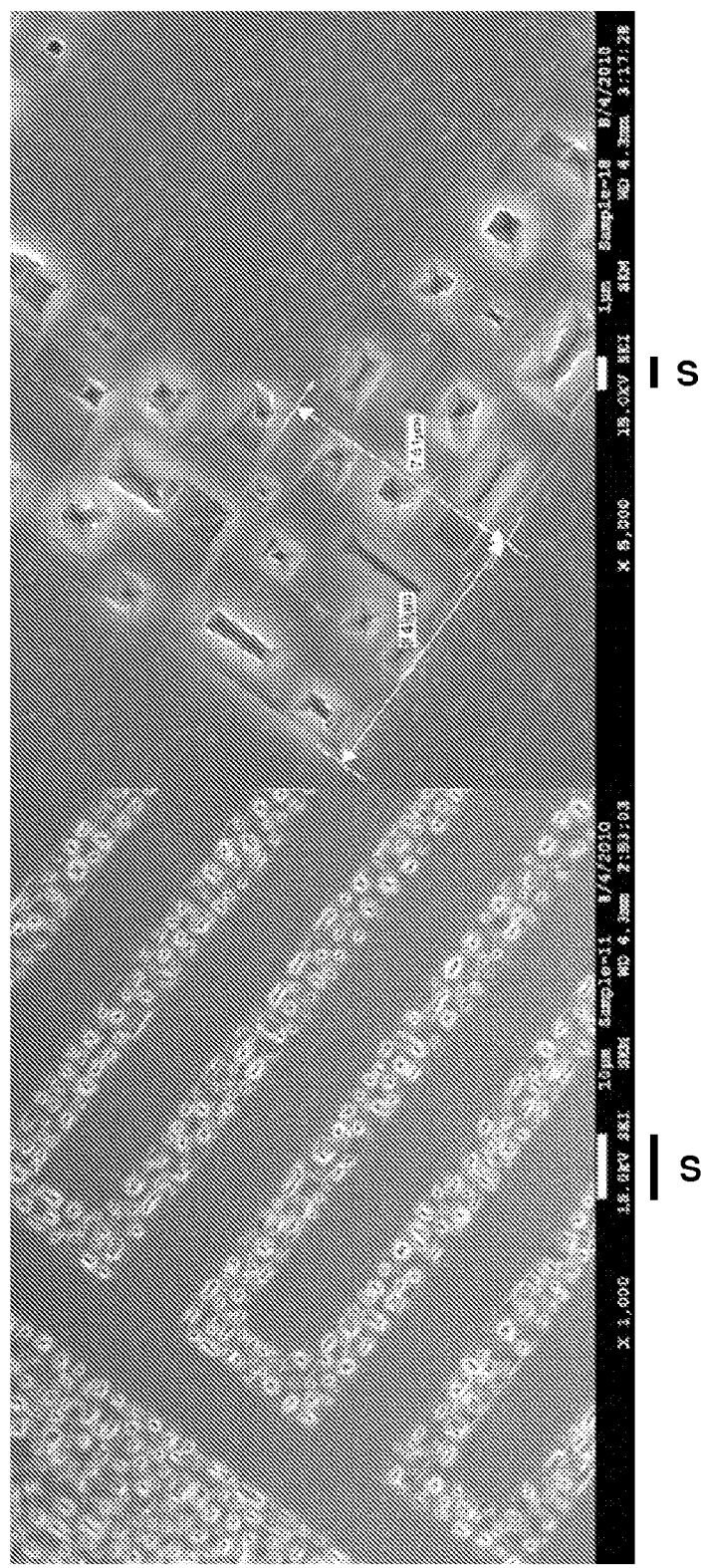
FIG. 5 includes scanning electron microscope (SEM) images of the preferentially anisotropically etched structure from FIG. 4 at higher (top image) and lower (bottom image)

FIG. 5 includes scanning electron microscope (SEM) images of the preferentially anisotropically etched structure from FIG. 4 at higher (top image; 1 µm scale bar) and lower (bottom image; 10 µm scale bar) levels of magnification. It is seen from the figure that the edges of the pyramidal recess bases are essentially aligned with the edges of the original nickel strips. However, this is due to the intentional alignment of the original nickel strip pattern with the internal (111) surfaces of the SCD substrate.

FIG. 6 includes scanning electron microscope (SEM) images of the preferentially anisotropically etched structure from FIG. 4 at lower (top image; 1 µm scale bar) and higher (bottom image; 1 µm scale bar) levels of magnification. Structures A-E in FIG. 6 illustrate differently shaped pyramidal recesses including various combinations of substantially square, rectangular, full, and/or partial pyramids. Structures A-C are all substantially full, square pyramids (i.e., etched substantially to their apex) with base edges about 1.5 μm, 1.9 μm, and 2.0 μm in length, respectively. Structure D is a substantially full, non-square pyramid with base edges of about 1.8 μm and about 4.5 μm in length. Structure E is a partial, non-square pyramid with base edges of about 1.3 μm and about 7.7 μm in length. The bottom of the recess (i.e., the top of the pyramid) has a width of about 0.5 μm.

The etched surface shown in FIGS. 5 and 6 was estimated to have a surface density of about $10^7$ recesses/cm$^2$ of area originally covered by the nickel strips. This surface density corresponds to an estimated relative surface area of about 40% (i.e., recess base area relative to original nickel pattern area), based on an approximate mean recess having a 2 μm×2 μm square base. The recess surface density, the size of the etched pyramids (e.g., length scales of the pyramidal base), and the relative surface area may be adjusted by the parameters of the preferential anisotropic etching process, for example by suitably selecting/controlling the thickness of the patterned metal (e.g., nickel) layer, the etch time, and/or the substrate temperature.

Experiments were conducted and SEM images taken with different thicknesses of nickel on the single crystal diamond substrate. The three nickel thin film thicknesses investigated included 25 nm, 47 nm and 102 nm. These nickel films were then patterned as shown in and as described above for FIG. 3, which specifically illustrates the patterned 102 nm layer that was similarly created for the thinner layers. The etching conditions used for each of the three etching experiments were a hydrogen plasma at a pressure of 160 Torr, a substrate temperature that was about the same for each run (although the observed variation for the three runs was 895-950° C. as measured with a one-color optical pyrometer), a hydrogen gas flow of 400 sccm, and a process time at the pressure of 160 Torr of 2 hours. In the sample with the nickel film thickness of 47 nm, the nickel film had an adhesion problem during the lithography and nickel etching process, so the pattern appears to not be regularly spaced along the nickel patterned lines as seen in FIG. 8. Changes in the nickel film thickness produced changes in the density, size and aspect ratio of the inverted (111) pyramids formed in the (100) surface of single crystal diamond. The thinnest nickel film layer (25 nm, FIG. 7) produced a result with the smallest pyramids, and the percentage coverage of the single crystal diamond with pyramids was the lowest. The nickel thickness of 47 nm (FIG. 8) produced predominantly pyramid shapes with larger aspect ratios. The thickest nickel film (102 nm, FIGS. 4-6) produced the highest coverage of the (100) surface with (111) inverted pyramid structures.

Experiments were conducted to characterize the effect of variable etching time. Two SCD substrates were formed with nickel patterns having a thickness of approximately 100 nm. One sample was preferentially etched for 2 minutes, and the second sample was preferentially etched for 2 hours. The etching time in both cases represent the process time at the pressure of 160 Torr at a substrate temperature of approximately 900° C. as described above. In addition to this processing time, each sample has a ramp-up phase in which the hydrogen plasma begins at a lower pressure of about 5 Torr, and it takes approximately 20 minutes to bring the pressure up to the 160 Torr. During this time, the substrate temperature is increasing up the 900° C. Once the processing time has ended, each sample also has a ramp-down phase in which the pressure is decreased with the hydrogen plasma on over a period of 10 minutes. FIG. 9A illustrates that the shorter hydrogen etching time of 2 minutes is characterized by the nickel forming into dots of various sizes along with the onset of preferential etching. FIG. 9B illustrates that the longer hydrogen etching time of 2 hours results in more well defined inverted pyramids as well as a smaller amount of nickel on the surface.

The surface of the preferentially etched diamond surface was analyzed using Energy Dispersive X-ray Microanalysis (EDS) both (i) after the etching process when nickel was still present and (ii) then after the nickel removal wet-etching step. EDS analysis confirmed that some nickel remained on the surface of the diamond after the hydrogen preferential etch process with nickel being found in some of the inverted pyramid structures (e.g., as also generally seen in FIG. 9B as light spots in some of the etched recesses). EDS analysis also indicated that residual nickel was no longer evident after the wet acid etch process for nickel removal.

As illustrated in Example 3 below, the pattern of etched recesses illustrated in FIGS. 5 and 6 would be suitable for further processing according to the disclosure to form a SCD structure (e.g., a p-n junction if the SCD substrate is p-type SCD) with the deposition of n-doped SCD into the etched recesses. For example, a mask (e.g., the same mask shape used to define the metal (nickel) pattern) could be used to deposit the n-doped SCD, in which case the n-type region would include pyramidal structures in the recesses (i.e., which would have a relatively high level of dopant/phosphorous incorporation based on the presence of (111) recess surface sidewalls) and some (100) surfaces (i.e., which would have a relatively low level of dopant/phosphorous incorporation) between the pyramids on the original SCD substrate. Thus, such a masking process can be used to prevent the deposition of the n-type doping layer in some or all of the regions originally void of the metal pattern used for preferential anisotropic etching. Alternatively or additionally, the upper surface of the deposited n-doped SCD (e.g., that which is above the original SCD substrate upper surface) can be polished/planarized, for example back to the original upper surface of the SCD substrate (e.g., surface 112 as shown in FIG. 1), hence leaving only n-type SCD in the pyramidal recess structures. A suitable polishing process includes conventional mechanical polishing with a polishing plate using a fine grain diamond abrasive or an abrasive slurry. In the event that the deposited n-doped SCD is not polished/planarized, a subsequent metal layer deposited over the resulting structure (e.g., the metal contact layer) could be used to form a diode structure that includes one or more of the (100) surface n-type SCD regions (i.e., the low dopant level regions) interspersed between the n-type SCD regions in the pyramidal recesses (i.e., the high dopant level regions).

Example 2

Deposition of P-Doped Diamond

Phosphorus can be added to diamond at higher concentration levels on the (111) surface of diamond than on the (100) surface of diamond. This example examines the properties of deposited phosphorous-doped diamond on a (111) SCD test substrate as a function of deposition conditions.

A test substrate having a (111) exposed surface was obtained from Sumitomo (Osaka, Japan), which was apparently obtained by cleaving a source diamond along the (111) surface. The substrate was subjected to a hydrogen plasma cleaning process to clean the surface and to remove a thin layer from the surface, which process is ordinarily used to clean a (100) surface and reduce the number of defects in diamond grown on the surface.

Phosphorous-doped diamond was then deposited onto the (111) substrate using microwave plasma-assisted chemical vapor deposition for a variety of operating conditions. The phosphorus was added into the plasma-assisted chemical vapor deposition process using phosphine ($PH_3$) gas added to a feed gas including methane ($CH_4$) and hydrogen ($H_2$). The phosphine gas was purchased diluted to 1000 ppm in hydrogen for the experiments. The ratio of ($CH_4$)/($H_2$) in the feed gas generally ranged from 0.25% to 1.25%, while the ratio of ($PH_3$)/($H_2$) in the feed gas generally ranged from 10 ppm to 500 ppm. The deposition pressure was 160 Torr, the deposition time generally ranged from 0.5 hr to 2 hr, and a water-cooled substrate holder was used to maintain a substrate temperature in the range of about 900° C. to 1000° C. (e.g., about 950° C.).

After the selected deposition time, the resulting P-doped diamond films were examined to determine whether single crystal or polycrystalline diamond had been formed. Some films additionally were tested to determine their phosphorous content and/or their electrical conductivity properties. A summary of the results is provided in Table 1 below, which results illustrate the influence of factors such as hydrocarbon feed and phosphorous feed on the ability to form a single crystal P-doped films.

TABLE 1

Deposition of Phosphorous-Doped Diamond on a (111) Substrate

| Sample | ($CH_4$)/($H_2$) Feed | ($PH_3$)/($H_2$) Feed | Deposition Time | Film Type | Continuous Film? | Phosphorous in Film (max) |
|---|---|---|---|---|---|---|
| 1 | 1.25% | 10 ppm | 1 hr | SCD | Yes | $4 \times 10^{17}/cm^3$ |
| 2 | 1.25% | 50 ppm | 0.5 hr | PCD | Yes | — |
| 3 | 0.5% | 50 ppm | 1 hr | SCD | Partially | — |
| 4 | 0.5% | 50 ppm | 2 hr | PCD | Yes | — |
| 5 | 0.5% | 500 ppm | 1 hr | SCD, PCD | Partially | — |
| 6 | 0.5% | 500 ppm | 2 hr | PCD | Yes | — |
| 7 | 0.25% | 500 ppm | 2 hr | SCD | Yes | $1.2 \times 10^{20}/cm^3$ |

Sample 1 was measured using secondary ion mass spectrometry (SIMS) to determine the amount of phosphorus incorporated into the film. The phosphorus was incorporated at a level of approximately $4 \times 10^{17}$ cm$^{-3}$, which was roughly constant throughout the 2.7 μm-thick SCD film. Sample 2 was examined and it did not have a smooth surface indicative of single crystal diamond; rather, it appeared that the surface was or was becoming polycrystalline in nature. Sample 2 appeared to be twinning at the (111) surface of the diamond as it grew; the twinning phenomenon can be reduced or eliminated if the deposition conditions are adjusted (e.g., reduction of methane percentage in the feedgas). Relative to Sample 2, Sample 3 had a lower methane feed concentration and the same phosphine concentration. Microscopic examination of Sample 3 showed that the diamond deposition appeared to be epitaxial as compare to Sample 2, thus reducing twinning albeit at a lower diamond deposition rate. However, the low deposition rate and corresponding thin film thickness of Sample 3 resulted in the film being discontinuous in certain regions of the growth substrate. An attempt to obtain a thicker film using the same feed gas at a longer deposition time of two hours, however, resulted in a polycrystalline surface (Sample 4). Samples 5 and 6 are analogous to Samples 3 and 4, but at a higher phosphine feed: a low deposition time yielded a film that had a single crystal structure in some regions, but was discontinuous in others (Sample 5), while a higher deposition time yielded a continuous but polycrystalline film (Sample 6; potentially also the result of twinning).

Sample 7 was formed using a ratio of ($CH_4$)/($H_2$) of 0.25% and a ratio of ($PH_3$)/($H_2$) of 500 ppm in the feed gas with a deposition time of 2 hours, a deposition temperature of 970° C., and a deposition pressure of 160 Torr. A microscope photograph of the deposition surface indicated that the diamond layer deposited on the (111) diamond substrate appeared single crystal in nature. The deposited film had a thickness of about 1 μm and it was measured using SIMS to determine the amount of phosphorus incorporated into the film. The SIMS measurement showed an average phosphorus concentration in the deposited layer of about $5.6 \times 10^{19}$ cm$^{-3}$. The film had a high phosphorus concentration near the surface (at a depth between about 0.1 μm to 0.3 μm) exceeding $1 \times 10^{20}$ cm$^{-3}$ and a peak concentration of about $1.2 \times 10^{20}$ cm$^{-3}$ at a depth of about 0.2 μm. The film had a lower phosphorus concentration of slightly above $1 \times 10^{19}$ cm$^{-3}$ at is maximum depth of about 1 μm.

The electrical conductance of the film also was measured using a simple two point probe test. The current that flows between the two probes touched to the sample is on the order of microamps with 1-10 volts applied. The activation energy of the electrical conduction was measured to be 0.052 eV by varying the temperature from room temperature to 105° C. The activation energy is consistent with Reference 7 and is much smaller than the activation energy of the deep donor energy level of phosphorus, which is 0.58 eV below the conduction band.

Example 3

Deposition of P-Doped Diamond onto Preferentially Etched SCD Substrate

Example 3 illustrates the deposition of phosphorous-doped diamond onto a preferentially etched (100) substrate having recesses with (111) surfaces therein.

A (100) SCD substrate was preferentially etched as described in Example 1. FIG. 10 is an optical microscope image of the preferentially etched substrate, where the darker regions represent the randomly located preferential etch sites formed by the nickel-catalyzed etching process. Each illustrated etch location (i.e., a dark region in the figure) is a square or rectangular region defining the base of an inverted pyramidal recess having (111) surface sidewalls.

Phosphorous-doped diamond was then deposited onto the preferentially etched substrate shown in FIG. 10 as described in Example 2 for Sample 7 (500 ppm phosphine and 0.25% methane in the predominantly hydrogen feed gas, a deposition pressure of 160 Torr, and a deposition temperature in the range of 950-1000° C.) for 30 minutes. FIG. 11 is a SEM image of the preferentially etched substrate after 30 minutes of deposition. The SEM image is in the vicinity of an inverted pyramid region from FIG. 10, and it illustrates diamond deposition across the surface. The center portion of FIG. 11 illustrates a position where an inverted pyramid with (111) surfaces appears to have been located at the start of the deposition.

Because other modifications and changes varied to fit particular operating requirements and environments will be apparent to those skilled in the art, the disclosure is not considered limited to the examples chosen for purposes of illustration, and covers all changes and modifications which do not constitute departures from the true spirit and scope of this disclosure.

Accordingly, the foregoing description is given for clarity of understanding only, and no unnecessary limitations should be understood therefrom, as modifications within the scope of the disclosure may be apparent to those having ordinary skill in the art.

Throughout the specification, where the compositions, processes, or apparatus are described as including components, steps, or materials, it is contemplated that the compositions, processes, or apparatus can also comprise, consist essentially of, or consist of, any combination of the recited components or materials, unless described otherwise. Component concentrations expressed as a percent are weight-percent (% w/w), unless otherwise noted or unless they represent gaseous mixtures in which case they can reflect molar or volume fractions/percents. Other volumetric concentrations or surface densities without units are expressed as a number concentration/density unless otherwise noted. Numerical values and ranges can represent the value/range as stated or an approximate value/range (e.g., with or without the term "about"). Combinations of components are contemplated to include homogeneous and/or heterogeneous mixtures, as would be understood by a person of ordinary skill in the art in view of the foregoing disclosure.

REFERENCES

1. Asmussen et al. U.S. Publication No. 2009/0239078 ("Process and apparatus for diamond synthesis").
2. Asmussen et al. U.S. Publication No. 2010/0034984 ("Microwave plasma reactors").
3. D. T. Tran, T. A. Grotjohn, D. K. Reinhard and J. Asmussen, "Microwave plasma-etching of diamond", *Diamond and Related Materials,* 17, 717-721, 2008.
4. D. T. Tran, C. Fansler, T. A. Grotjohn, D. K. Reinhard and J. Asmussen, "Investigation of mask selectivities and diamond etching using microwave plasma-assisted etching," *Diamond and Related Materials,* 19, 778-782, 2010.
5. R. Ramamurti, M. Becker, T. Schuelke, T. A. Grotjohn, D. K. Reinhard, J. Asmussen, "Deposition of thick boron-doped homoepitaxial single crystal diamond by microwave plasma chemical vapor deposition," Diamond and Related Materials, 18, pp. 704-706, 2009.
6. W. Smirnov, A. Kriele, D. Brink, W. Mueller-Sebert, O. Williams, J. Hees, and C. Nebel, "Anisotropic etching of diamond by nano/micro sized Ni particles and their formation," Symposium J, MRS Fall 2009, Boston.
7. Kato, H. et al., "Characterization of specific contact resistance on heavily phosphorus-doped diamond films," Diamond & Related Materials 18 (2009) 782-785.
8. Kato, H. et al., "Selective Growth of Buried n$^+$ Diamond on (001) Phosphorous-Doped n-Type Diamond Film," Applied Physics Express 2 (2009) 055502.

What is claimed is:

1. A method for forming an n-doped single crystal diamond (SCD) structure, the method comprising:
    (a) providing a SCD layer having a growth surface;
    (b) preferentially anisotropically etching a plurality of randomly sized and positioned recesses in the SCD layer through the growth surface, the recesses each (A) being defined by one or more (111) surface sidewalls etched into the SCD layer through the growth surface, (B) having a base defined by intersections of the sidewalls and the growth surface of the SCD layer, and (C) having pyramidal shapes with rectangular bases having a distribution of aspect ratios ranging from 1 to more than 1, the aspect ratio of each rectangular base being a ratio of a long side relative to a short side of the rectangular base; and
    (c) depositing n-doped SCD into the recesses, thereby forming an n-doped SCD region in the recesses and the n-doped SCD structure.

2. The method of claim 1, wherein the growth surface of the SCD layer is a (100) surface.

3. The method of claim 1, wherein the SCD layer is selected from the group consisting of p$^-$-type SCD and p-type SCD, and the n-doped SCD structure functions as a p-n junction.

4. The method of claim 1, wherein the SCD layer comprises a boron impurity.

5. The method of claim 1, wherein the recesses have a full or partial pyramidal shape with the base of each recess corresponding to the base of the pyramidal shape and being substantially coplanar with the growth surface of the SCD layer.

6. The method of claim 5, wherein the base of the pyramidal shape is rectangular.

7. The method of claim 5, wherein the recesses have the full pyramidal shape with an apex opposing each base and being defined by the intersection of recess sidewalls.

8. The method of claim 5, wherein the recesses have the partial pyramidal shape with a top surface opposing each base and being defined by a (100) surface wall etched into the SCD layer and intersected by the recess sidewalls.

9. The method of claim 1, wherein the recesses each are defined by four (111) surface sidewalls.

10. The method of claim 1, wherein preferentially anisotropically etching the recesses in part (b) comprises:
    (i) depositing a patterned metal layer over the growth surface of the SCD layer, the patterned metal layer having a shape corresponding to a surface region to be preferentially anisotropically etched to form one or more recesses, thereby forming a metal-patterned SCD substrate;
    (ii) exposing the metal-patterned SCD substrate to a hydrogen source at a sufficiently high temperature, thereby preferentially anisotropically removing SCD material from the SCD layer under the patterned metal layer to form the sidewalls and the recesses; and
    (iii) removing metal remaining in the recesses and/or on the growth surface after preferential anisotropic removal of the SCD material.

11. The method of claim 10, wherein depositing the patterned metal layer in part (i) comprises:
    (A) depositing a metal layer over the growth surface of the SCD layer; and
    (B) patterning the deposited metal layer, thereby forming the patterned metal layer.

12. The method of claim 10, wherein part (ii) comprises forming the plurality of randomly sized recesses having (111) surface sidewalls, the recesses being randomly positioned in the SCD layer in a region corresponding to that of the patterned metal layer in part (i).

13. The method of claim 10, wherein the patterned metal layer is a patterned nickel layer.

14. The method of claim 1, wherein the n-doped SCD region comprises a phosphorous impurity.

15. The method of claim 1, wherein depositing the n-doped SCD into the recesses comprises:
   (i) depositing an n-doped SCD layer over the SCD layer growth surface and in the recesses;
   (ii) removing at least a portion of the deposited n-doped SCD layer over the SCD layer growth surface while leaving the deposited n-doped SCD layer in the recesses, thereby forming the n-doped SCD region in the recesses.

16. The method of claim 1, wherein an internal boundary between the n-doped SCD region and a surrounding SCD layer in the n-doped SCD structure is defined by a concentration discontinuity of an n-type dopant in the n-doped SCD region and in the surrounding SCD layer across the one or more surface sidewalls of the recesses.

17. A method for forming an n-doped single crystal diamond (SCD) structure, the method comprising:
   (a) providing a SCD layer having a growth surface;
   (b) preferentially anisotropically etching a plurality of randomly sized and positioned recesses in the SCD layer through the growth surface, the recesses each (A) being defined by one or more (111) surface sidewalls etched into the SCD layer through the growth surface and (B) having a base defined by intersections of the sidewalls and the growth surface of the SCD layer; and
   (c) depositing n-doped SCD into the recesses, thereby forming an n-doped SCD region in the recesses and the n-doped SCD structure.

18. The method of claim 17, wherein the growth surface of the SCD layer is a (100) surface.

19. The method of claim 17, wherein the SCD layer is selected from the group consisting of p⁻-type SCD and p-type SCD, and the n-doped SCD structure functions as a p-n junction.

20. The method of claim 17, wherein the SCD layer comprises a boron impurity.

21. The method of claim 17, wherein the recesses have a full or partial pyramidal shape with the base of each recess corresponding to the base of the pyramidal shape and being substantially coplanar with the growth surface of the SCD layer.

22. The method of claim 21, wherein the base of the pyramidal shape is rectangular.

23. The method of claim 21, wherein the recesses have the full pyramidal shape with an apex opposing each base and being defined by the intersection of recess sidewalls.

24. The method of claim 21, wherein the recesses have the partial pyramidal shape with a top surface opposing each base and being defined by a (100) surface wall etched into the SCD layer and intersected by recess sidewalls.

25. The method of claim 17, wherein the recesses each are defined by four (111) surface sidewalls.

26. The method of claim 17, wherein preferentially anisotropically etching the recesses in part (b) comprises:
   (i) depositing a patterned metal layer over the growth surface of the SCD layer, the patterned metal layer having a shape corresponding to a surface region to be preferentially anisotropically etched to form one or more recesses, thereby forming a metal-patterned SCD substrate;
   (ii) exposing the metal-patterned SCD substrate to a hydrogen source at a sufficiently high temperature, thereby preferentially anisotropically removing SCD material from the SCD layer under the patterned metal layer to form the sidewalls and the recesses; and
   (iii) removing metal remaining in the recesses and/or on the growth surface after preferential anisotropic removal of the SCD material.

27. The method of claim 26, wherein depositing the patterned metal layer in part (i) comprises:
   (A) depositing a metal layer over the growth surface of the SCD layer; and
   (B) patterning the deposited metal layer, thereby forming the patterned metal layer.

28. The method of claim 26, wherein part (ii) comprises forming the plurality of randomly sized recesses having (111) surface sidewalls, the recesses being randomly positioned in the SCD layer in a region corresponding to that of the patterned metal layer in part (i).

29. The method of claim 26, wherein the patterned metal layer is a patterned nickel layer.

30. The method of claim 17, wherein the n-doped SCD region comprises a phosphorous impurity.

31. The method of claim 17, wherein depositing the n-doped SCD into the recesses comprises:
   (i) depositing an n-doped SCD layer over the SCD layer growth surface and in the recesses;
   (ii) removing at least a portion of the deposited n-doped SCD layer over the SCD layer growth surface while leaving the deposited n-doped SCD layer in the recesses, thereby forming the n-doped SCD region in the recesses.

32. The method of claim 17, wherein an internal boundary between the n-doped SCD region and a surrounding SCD layer in the n-doped SCD structure is defined by a concentration discontinuity of an n-type dopant in the n-doped SCD region and in the surrounding SCD layer across the one or more surface sidewalls of the recesses.

* * * * *